United States Patent
Lee et al.

(10) Patent No.: US 11,894,409 B2
(45) Date of Patent: Feb. 6, 2024

(54) BACK SIDE ILLUMINATION IMAGE SENSORS AND ELECTRONIC DEVICE INCLUDING THE SAME

(71) Applicant: Samsung Electronics Co., Ltd., Suwon-si (KR)

(72) Inventors: Yun Ki Lee, Hwaseong-si (KR); Jong Hoon Park, Hwaseong-si (KR); Jun Sung Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/409,048

(22) Filed: Aug. 23, 2021

(65) Prior Publication Data

US 2021/0384234 A1 Dec. 9, 2021

Related U.S. Application Data

(63) Continuation of application No. 16/775,481, filed on Jan. 29, 2020, now Pat. No. 11,101,314, which is a
(Continued)

(30) Foreign Application Priority Data

Dec. 21, 2018 (KR) ........................ 10-2018-0167379

(51) Int. Cl.
*H01L 27/146* (2006.01)
*H10K 59/13* (2023.01)

(52) U.S. Cl.
CPC ...... *H01L 27/1464* (2013.01); *H01L 27/1461* (2013.01); *H01L 27/1463* (2013.01);
(Continued)

(58) Field of Classification Search
CPC ........... H01L 27/1461; H01L 27/14612; H01L 27/1462; H01L 27/14623; H01L 27/1463;
(Continued)

(56) References Cited

U.S. PATENT DOCUMENTS 6,060,732 A 5/2000 Murakami et al.
6,468,826 B1 10/2002 Murakami et al.
(Continued)

FOREIGN PATENT DOCUMENTS

JP 2010-186818 A 8/2010
JP 2016-48801 A 4/2016
(Continued)

OTHER PUBLICATIONS

Non-Final Office Action dated Sep. 14, 2020 in U.S. Appl. No. 16/775,481.
(Continued)

*Primary Examiner* — Matthew E. Gordon
(74) *Attorney, Agent, or Firm* — Harness, Dickey & Pierce, P.L.C.

(57) ABSTRACT

In some example embodiments, a back side illumination (BSI) image sensor may include a pixel configured to generate electrical signals in response to light incident on a back side of a substrate. In some example embodiments, the pixel includes, a photodiode, a device isolation film adjacent to the photodiode, a dark current suppression layer above the photodiode, a light shield grid above the photodiode and including an opening area of 1 to 15% of an area of the pixel, a light shielding filter layer above the light shield grid, a planarization layer above the light shielding filter layer, a lens above the planarization layer, and/or an anti-reflective film between the photodiode and the lens.

20 Claims, 8 Drawing Sheets

Related U.S. Application Data continuation of application No. 16/451,561, filed on Jun. 25, 2019, now Pat. No. 11,121,167.

(52) U.S. Cl.
CPC .. *H01L 27/14612* (2013.01); *H01L 27/14621* (2013.01); *H01L 27/14623* (2013.01); *H01L 27/14645* (2013.01); *H10K 59/13* (2023.02)

(58) Field of Classification Search
CPC .......... H01L 27/1464; H01L 27/14645; H01L 27/14643; H01L 27/14621; H01L 27/14685; H01L 27/3269; H10K 59/13
USPC ........................................................ 257/432
See application file for complete search history.

(56) References Cited

U.S. PATENT DOCUMENTS

| | | | |
|---|---|---|---|
| 6,614,479 B1 | 9/2003 | Fukusho et al. | |
| 7,875,948 B2 | 1/2011 | Hynecek et al. | |
| 8,648,943 B2 | 2/2014 | Godaiin | |
| 8,698,064 B2 | 4/2014 | Otake et al. | |
| 8,987,751 B2 | 3/2015 | Ihara | |
| 9,136,298 B2 | 9/2015 | Lin et al. | |
| 9,159,755 B2 | 10/2015 | Choi et al. | |
| 9,257,477 B2 | 2/2016 | Godaiin | |
| 9,356,061 B2 | 5/2016 | Fan et al. | |
| 9,515,120 B2 | 12/2016 | Um et al. | |
| 9,640,578 B2 | 5/2017 | Godaiin | |
| 9,659,981 B2 | 5/2017 | Ting et al. | |
| 9,812,488 B2 | 11/2017 | Tsai et al. | |
| 9,829,614 B2 | 11/2017 | Smith et al. | |
| 9,954,021 B2 | 4/2018 | Yamaguchi et al. | |
| 10,868,203 B1* | 12/2020 | Lee .................... | H01L 31/0203 |
| 2004/0079865 A1 | 4/2004 | Hoshi | |
| 2009/0002531 A1 | 1/2009 | Godaiin | |
| 2009/0302408 A1 | 12/2009 | Nakagawa et al. | |
| 2011/0241148 A1 | 10/2011 | Hiyama et al. | |
| 2013/0075591 A1 | 3/2013 | Otake et al. | |
| 2013/0270663 A1 | 10/2013 | Lin et al. | |
| 2014/0339606 A1 | 11/2014 | Lin et al. | |
| 2014/0374868 A1 | 12/2014 | Lee et al. | |
| 2016/0064430 A1 | 3/2016 | Lee et al. | |
| 2016/0204151 A1* | 7/2016 | Godaiin ............ | H01L 27/14625 |
| | | | 257/292 |
| 2016/0307943 A1 | 10/2016 | Cheng et al. | |
| 2017/0017824 A1* | 1/2017 | Smith .................... | G02B 6/005 |
| 2017/0083745 A1 | 3/2017 | Goodelle et al. | |
| 2017/0109564 A1 | 4/2017 | Seo et al. | |
| 2017/0110501 A1 | 4/2017 | Hsu et al. | |
| 2017/0220844 A1 | 8/2017 | Jones et al. | |
| 2017/0271383 A1 | 9/2017 | Lai et al. | |
| 2018/0081098 A1 | 3/2018 | Smith et al. | |
| 2018/0301494 A1 | 10/2018 | Park et al. | |
| 2019/0348452 A1* | 11/2019 | Ootsuka ............ | H01L 27/14685 |
| 2020/0035729 A1 | 1/2020 | Lee et al. | |
| 2020/0127042 A1 | 4/2020 | Lin et al. | |
| 2020/0176497 A1 | 6/2020 | Kim et al. | |
| 2020/0219913 A1 | 7/2020 | Lee et al. | |

FOREIGN PATENT DOCUMENTS

| | | |
|---|---|---|
| KR | 10-0297038 B1 | 11/2001 |
| KR | 10-2009-0004465 A | 1/2009 |
| KR | 20160048643 A | 5/2016 |
| WO | WO-2011/148574 A1 | 12/2011 |

OTHER PUBLICATIONS

Notice of Allowance dated Apr. 16, 2021 in U.S. Appl. No. 16/775,481.
Notice of Allowance dated May 5, 2021 in U.S. Appl. No. 16/451,561.
Office Action dated Mar. 9, 2023 in Chinese Application No. 201910739677.X.
Office Action dated Mar. 27, 2023 in Chinese Application No. 202010119013.6.

* cited by examiner

BACK SIDE ILLUMINATION IMAGE SENSORS AND ELECTRONIC DEVICE INCLUDING THE SAME

CROSS-REFERENCE TO THE RELATED APPLICATIONS

This U.S. nonprovisional patent application is a continuation of U.S. patent application Ser. No. 16/775,481, filed on Jan. 29, 2020, which is a continuation of U.S. patent application Ser. No. 16/451,561, filed on Jun. 25, 2019, which claims priority under 35 U.S.C. § 119 to and the benefit of Korean Patent Application No. 10-2018-0167379, filed on Dec. 21, 2018, in the Korean Intellectual Property Office (KIPO), the disclosure of each of which are incorporated herein by reference in its entirety.

BACKGROUND

1. Field

Some example embodiments of some inventive concepts relate to backside illumination (BSI) image sensors and/or electronic devices including the same.

2. Description of Related Art

Image sensors are devices that convert light into electrical signals. With the recent development of computer industry and communication industry, the image sensors having improved performance may be utilized in various devices such as camcorders, game machines, digital cameras, display devices, mobile phones (e.g., smartphones), and the like. Front side illumination (FSI) image sensors may exhibit disadvantages, such as a decrease in light-receiving efficiency due to an arrangement of wiring above a photodiode. Back side illumination (BSI) image sensors, wherein the wiring of the photodiode is below the photodiode, may provide improved light-receiving efficiency as compared with FSI image sensors.

SUMMARY

A back side illumination image sensor according to some example embodiments of some inventive concepts includes a pixel configured to generate electrical signals in response to incident light. The pixel comprises a photodiode, a device isolation film adjacent to the photodiode, a dark current suppression layer above the photodiode, a light shield grid above the photodiode and including an opening area of 1 to 15% of an area of the pixel, a light shielding filter layer above the light shield grid, a planarization layer above the light shielding filter layer, a lens above the planarization layer, and an anti-reflective film between the photodiode and the lens.

A back side illumination image sensor according to some example embodiments of some inventive concepts includes a plurality of pixels configured to generate electrical signals in response to light incident on a back side of a substrate, and a plurality of readout circuits configured to read the electrical signals of the plurality of pixels. Each pixel of the plurality of pixels comprises a photodiode, a dark current suppression layer above the photodiode, a light shield grid above the photodiode and including an opening area that is aligned to a central portion of the photodiode, a planarization layer above the light shield grid, a lens above the planarization layer, and an anti-reflective film between the photodiode and the lens.

A back side illumination image sensor according to some example embodiments of some inventive concepts includes a plurality of pixels configured to generate electrical signals in response to light incident on a back side of a substrate, and a plurality of readout circuits configured to read the electrical signals of the plurality of pixels. Each pixel of the plurality of pixels comprises a photodiode, a light shield grid above the photodiode and including an opening area of 1 to 15% of an area of the pixel, a planarization layer on the light shield grid, a lens above the planarization layer, an anti-reflective film between the photodiode and the lens, and a display panel is above the lens.

DETAILED DESCRIPTION OF EXAMPLE EMBODIMENTS

Figure 1:
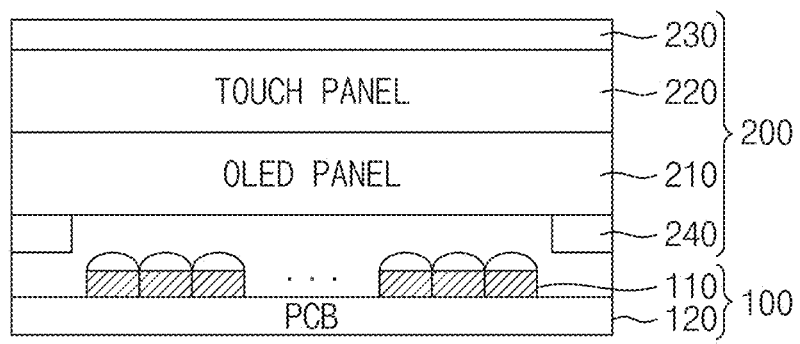
FIG. 1 is a view illustrating an electronic device including a BSI image sensor according to some example embodiments of some inventive concepts.

FIG. 1 is a view illustrating an electronic device including a BSI image sensor according to some example embodiments of some inventive concepts.

Referring to FIG. 1, an electronic device 10 according to some example embodiments of some inventive concepts may include an image sensor 100 and a display module 200. The display module 200 that is configured to display images may be disposed on an upper side, and the image sensor 100 may be arranged under the display module 200. The display module 200 may include an organic light emitting diode (OLED) panel 210 as a display panel configured to display the images. The display module 200 may include a touch panel 220 configured to sense a user's touch. The touch panel 220 may be disposed above the OLED panel 210. The display module 200 may include a protection film 230 disposed above the touch panel 220 and a cushion 240 configured to buffer an impact applied when touched.

In some example embodiments, an OLED panel 210 may be configured to display the image on the basis of an input image signal and may display the image by self-emitting without a backlight. Some OLED panels 210 may have a low thickness in a height direction as no backlight is involved. As used herein, "height direction" means a direction that is substantially orthogonal to a planar surface of the substrate. Some touch panels 220 may utilize sensors provided on a surface thereof to detect the touch input by converting a change in states of the sensors such as a change in pressure, a change in capacitance, a change in light amount, and the like applied to the surface into an electric signal. FIG. 1 includes an example embodiment in which the OLED panel 210 is applied as the display panel is shown. Some example embodiments of some inventive concepts may not be limited thereto; for example, in some example embodiments, as an alternative to an OLED panel 210, other types of display panels through which light may be transmitted may be included.

Some example embodiments may include touch panels 220 that are implemented as a resistive type, a capacitive type, a surface acoustic wave type, or an infrared type. In some example embodiments, the protection film 230 may be disposed on a front surface of the touch panel 220 and/or may be formed thereon so as to have a certain (e.g., desired and/or selected) thickness in a height direction to protect the front surface of the touch panel 220. In some example embodiments, a protection film 230 may prevent or reduce light incident from the outside of the touch panel 220 from being reflected.

In some example embodiments, an image sensor 100 may include a plurality of pixels 110 and/or a printed circuit board (PCB) 120 on which a processor and/or a driving circuit, which may be configured to drive the plurality of pixels 110, are disposed. In some example embodiments, each of the plurality of pixels 110 may be formed in the form of a chip, and/or the plurality of pixels 110 in a chip form may be disposed above the PCB 120. That is, in some example embodiments, unit pixels in the chip form may be gathered to of a pixel array, and/or the pixel array may be disposed on the PCB 120.

In some example embodiments, an image sensor 100 may include a complementary metal oxide semiconductor (CMOS) image sensor (CIS). In some example embodiments, the image sensor 100 may be configured to convert the received light into the electrical signal, to generate a sensing signal when the image sensor 100 is touched by a finger of a user, and/or to output the sensing signal to the processor. In some example embodiments, a processor may generate a fingerprint image based on the sensing signal received at the image sensor 100.

The electronic device 10 according to some example embodiments of some inventive concepts may include communication functions. In some example embodiments, the electronic device 10 may include one or more of a smartphone, a tablet personal computer (PC), a mobile phone, a wearable device (e.g., a smart watch), an e-book, a netbook computer, a personal digital assistant (PDA), a portable multimedia player (PMP), a mobile medical instrument, and/or a digital camera.

Figure 2:
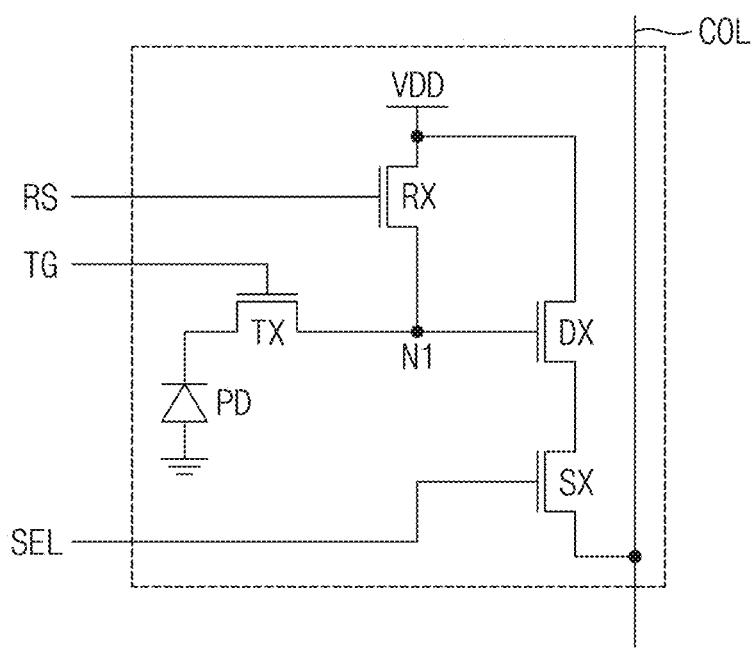
FIG. 2 is a circuit diagram of a unit pixel of an image sensor according to some example embodiments.

FIG. 2 is a circuit diagram of the unit pixel of an image sensor according to some example embodiments.

In the circuit diagram of FIG. 2, each of the plurality of pixels 110 may include a photodiode PD, which is a photosensitive device, and/or a plurality of transistors TX, RX, DX, and SX as a readout circuit. In some example embodiments, the readout circuit may drive the photodiode PD and/or read an electrical signal generated by the photodiode PD. In some example embodiments, the readout circuit may include a transfer transistor TX, a driving transistor DX, a selection transistor SX, and/or a reset transistor RX.

In some example embodiments, photocharges generated by the photodiode PD may be output to a first node N1 (for example, a floating diffusion node) through the transfer transistor TX.

In some such example embodiments, while a transfer control signal TG is a first level (e.g., a logical high level), a transfer transistor TX may be turned on. In some example embodiments, while a transfer transistor TX is turned on, photocharges generated by the photodiode PD may be output to a first node N1 through a transfer transistor TX.

In some example embodiments, a driving transistor DX may operate as a source follower buffer amplifier. For example, a driving transistor DX may amplify a signal corresponding to the charges stored in the first node N1.

In some example embodiments, a selection transistor SX may be turned on in response to a selection signal SEL. While the selection transistor SX is turned on, a signal amplified by the driving transistor DX may be transmitted to a column line COL.

In some example embodiments, a reset transistor RX may be turned on in response to a reset signal RS. While the reset transistor RX is turned on, the charges stored in the first node N1 may be discharged.

FIG. 2 illustrates a pixel 110 including one photodiode PD and four MOS transistors TX, RS, DX, and SX according to some example embodiments. Example embodiments of some inventive concepts may not be limited thereto. For example, in some other example embodiments, a pixel may include one photodiode PD and three or fewer MOS transistors. In still other example embodiments, a pixel may include one photodiode PD and five or more MOS transistors.

Figure 3A:
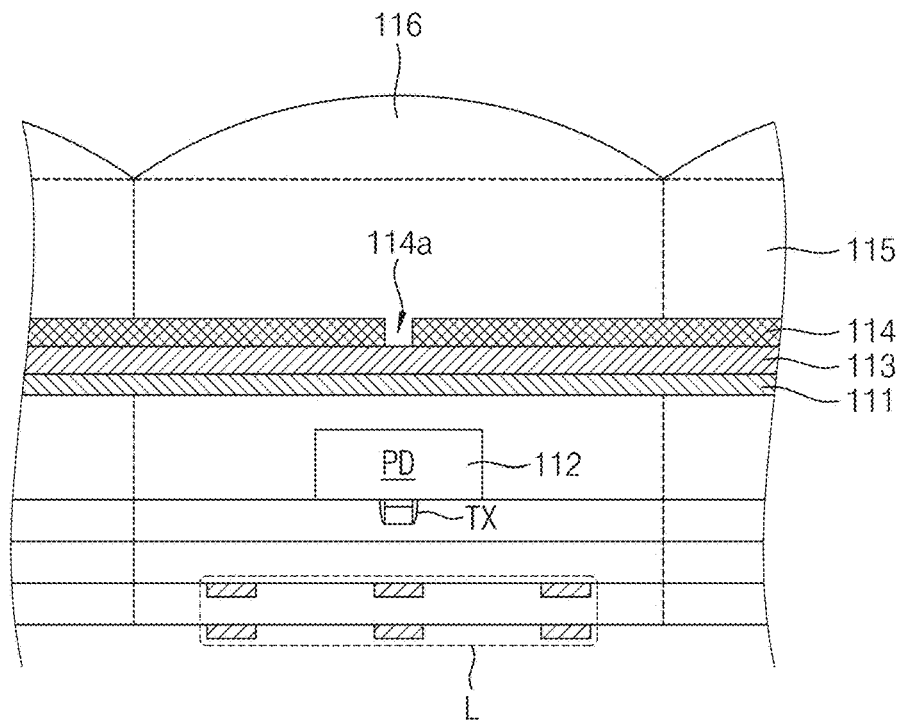
FIG. 3A is a view illustrating an image sensor according to some example embodiments of some inventive concepts, in which an anti-reflective film and a dark current suppression layer are disposed between a light shield grid and a photodiode.
Figure 3B:
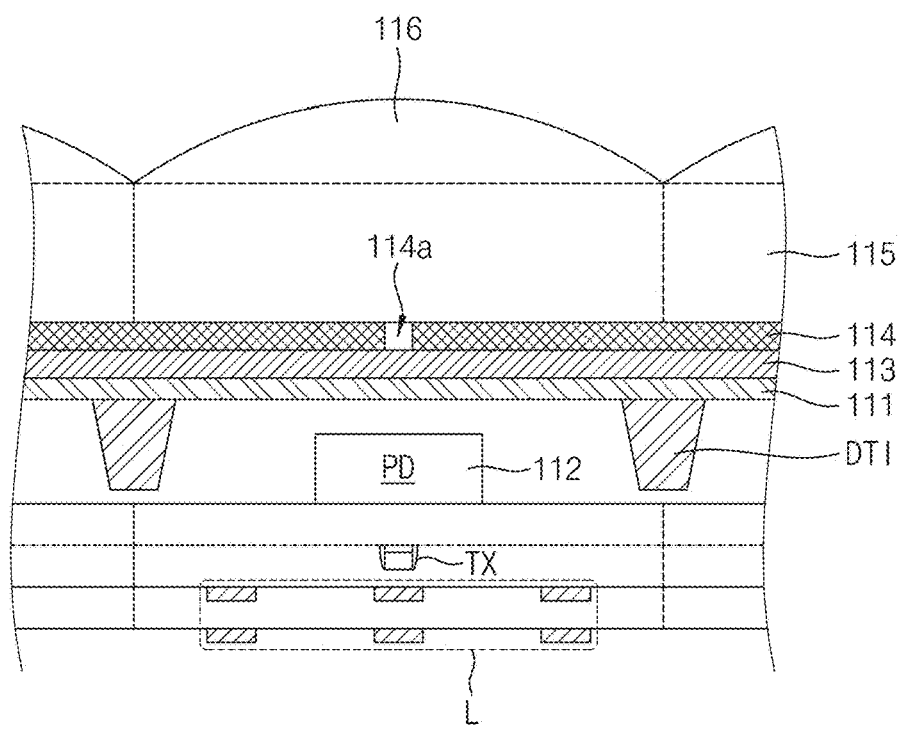
FIG. 3B is a view illustrating a device isolation film of a pixel shown in FIG. 3A according to some example embodiments.

FIG. 3A is a view illustrating an image sensor according to some example embodiments of some inventive concepts, in which an anti-reflective film and a dark current suppression layer are disposed between a light shield grid and a photodiode. FIG. 3B is a view illustrating a device isolation film of the pixel shown in FIG. 3A according to some example embodiments.

Referring to FIGS. 1 and 3A, a pixel 110 of a BSI image sensor 100 is shown. In some example embodiments, each of the plurality of pixels 110 may include a dark current suppression layer 111, a photodiode 112, an anti-reflective film 113, a light shield grid 114, a planarization layer 115, and/or a lens 116.

As shown in FIG. 3B, a deep trench isolation (DTI) having a certain (e.g., desired and/or selected) depth may be disposed between the pixels, and/or the dark current suppression layer 111 may be disposed above the photodiode 112, in some example embodiments.

In some example embodiments, the DTI may be configured to reduce interference between the pixels 110 and/or may be disposed to surround the pixel 110. For example, the DTI may be formed by forming a trench on a back side of a silicon substrate and then burying an insulating film in the trench. In some example embodiments, the DTI may be formed to have a depth of 1 μm to 5 μm, e.g., as a deep trench isolation layer including an insulating material. In some example embodiments, the DTI may include an insulating material having a refractive index smaller than that of the silicon substrate to prevent or reduce light incident on each pixel 110 from passing over another adjacent pixel 110. In some example embodiments, interference of the light between adjacent pixels 110 may be prevented and/or reduced by a DTI that is deeply formed in the substrate.

In some example embodiments, a photodiode 112 may be configured to receive the light to generate photocharges and/or may be formed on the back side of the silicon substrate. For example, a plurality of transistors (see FIG. 2) may be disposed as spaced apart from each other on the same layer as the photodiode 112 and/or may be disposed under the photodiode 112. In some example embodiments, wirings connecting the photodiode 112 to the transistors may be disposed under the photodiode 112 (a front side of the silicon substrate). During a manufacturing process of an image sensor 100 according to some example embodiments, a portion of a back side of the silicon substrate may be cut to a thickness in a height direction (for example, 3 μm) through which light may be transmitted, and/or a DTI and photodiode 112 may be formed on the back side of the silicon substrate; while the transistors and the wirings may be formed on the front side of the silicon substrate. In some example embodiments, the dark current suppression layer 111 may be disposed above the photodiode 112. In some example embodiments, the anti-reflective film 113 may be disposed above the dark current suppression layer 111; the light shield grid 114 may be disposed on the anti-reflective film 113; the planarization layer 115 may be disposed on the light shield grid 114; and/or the lens 116 may be disposed on the planarization layer 115. Some example embodiments of some inventive concepts may not be limited thereto; for example, in some example embodiments, a protection film may be disposed to cover the light shield grid 114.

In some example embodiments, a lens 116 may be formed in a cylindrical shape or a hemispherical shape (e.g., in order to promote the collection of incident light at one point). Light may be incident on the photodiode 112 through the back side of the silicon substrate. In the BSI image sensor 100, the wirings are disposed under the photodiode 112 so that the incident light is not disturbed by the wirings. Accordingly, in some example embodiments, a BSI image sensor 100 may be configured to collect light at a wide angle into the photodiode 112.

In some example embodiments, a pixel 110 may be configured to generate a photocurrent by photoelectric conversion while the light is incident thereon. A dark current, involving a constant amount of current that may be generated by the pixel 110 even while the light is not incident, may occur. In some example embodiments, dark current may degrade the performance of some image sensors, and it may be necessary, desirable, and/or advantageous to eliminate, prevent, reduce, and/or suppress the dark current. In some example embodiments of some inventive concepts, the dark current suppression layer 111 may be disposed above the photodiode 112.

Some example embodiments may include a dark current suppression layer 111 that is disposed on an upper surface of the silicon substrate, as shown in FIG. 3A.

Some example embodiments, such as shown in FIG. 3B, may include a dark current suppression layer 111 that is integrally formed with the DTI and/or disposed on a front side of the silicon substrate.

As one example, the DTI is formed on the back side of the silicon substrate, and then the dark current suppression layer 111 may be disposed above the photodiode 112 and the DTI.

In some example embodiments, formation of a dark current suppression layer 111 may include laminating a plurality of layers having a fixed negative charge. For example, each of the plurality of layers of the dark current suppression layer 111 may include one material or a combination of two or more materials selected from a group including aluminum oxide (AlO), tantalum oxide (TaO), hafnium oxide (HfO), zirconium oxide (ZrO), and lanthanum oxide (LaO).

In some example embodiments, formation of the dark current suppression layer 111 may include laminating two layers. For example, a dark current suppression layer 111 may include a lamination of an aluminum oxide (AlO) layer and a tantalum oxide (TaO) layer, and/or may be disposed above the photodiode 112. Some example embodiments may include a dark current suppression layer 111 that is disposed on the front side of the silicon substrate and/or that overlaps the photodiode 112. In some example embodiments, a dark current suppression layer 111 may include an aluminum oxide (AlO) layer that is disposed on a lower side and/or a tantalum oxide (TaO) layer that is disposed on an upper side. Some example embodiments of some inventive concepts may not be limited thereto; for example, some other example embodiments may include a dark current suppression layer 111 including a tantalum oxide (TaO) layer that is disposed on the lower side and/or an aluminum oxide (AlO) layer that is disposed on the upper side. Some example embodiments may include a dark current suppression layer 111 including an aluminum oxide (AlO) layer and a tantalum oxide (TaO) layer, each having a same or similar thickness in a height direction as other layers of the dark current suppression layer 111. Some example embodiments of some inventive concepts may not be limited thereto; for example, some other example embodiments may include a dark current suppression layer including an aluminum oxide (AlO) layer and a tantalum oxide (TaO) layer that have different thicknesses in a height direction.

In some example embodiments, the dark current suppression layer 111 may be formed by laminating two layers. For example, a dark current suppression layer 111 may be formed by laminating an aluminum oxide (AlO) layer and a hafnium oxide (HfO) layer above the photodiode 112. Some example embodiments may include a dark current suppression layer 111 that is disposed on the front side of the silicon substrate and/or that overlaps the photodiode 112. Some example embodiments may include a dark current suppression layer 111 including an aluminum oxide (AlO) layer that is disposed on the lower side and/or a hafnium oxide (HfO) layer that is disposed on the upper side. Some example embodiments of some inventive concepts may not be limited thereto; for example, some other example embodiments may include a dark current suppression layer 111 including a hafnium oxide (HfO) layer that is disposed on the lower side and/or an aluminum oxide (AlO) layer that is disposed on the upper side. Some example embodiments may include a dark current suppression layer 111 including an aluminum oxide (AlO) layer and a hafnium oxide (HfO) layer, each having a same or similar thickness in a height direction as other layers of the dark current suppression layer 111. Some example embodiments of some inventive concepts may not be not limited thereto; for example, some other example embodiments may include a dark current suppression layer 111 including an aluminum oxide (AlO) layer and a hafnium oxide (HfO) layer that have different thicknesses in a height direction.

Some example embodiments may include a dark current suppression layer 111 that is formed by laminating two layers. For example, a dark current suppression layer may include laminating a hafnium oxide (HfO) layer and/or a zirconium oxide (ZrO) layer, and/or may be disposed so as to overlap the photodiode 112. In some example embodiments, a dark current suppression layer 111 may be formed by laminating a zirconium oxide (ZrO) layer and a lanthanum oxide (LaO) layer above the photodiode 112.

Some example embodiments may include a dark current suppression layer 111 including a zirconium oxide (ZrO) layer that is disposed on the lower side and/or a lanthanum oxide (LaO) layer that is disposed on the upper side. Some example embodiments of some inventive concepts may not be limited thereto; for example, some other example embodiments may include a dark current suppression layer 111 including a lanthanum oxide (LaO) layer that is disposed on the lower side, and/or a zirconium oxide (ZrO) layer that is disposed on the upper side. Some example embodiments may include a dark current suppression layer 111 including a zirconium oxide (ZrO) layer and a lanthanum oxide (LaO) layer, each having a same or similar thickness in a height direction as other layers of the dark current suppression layer 111. Some example embodiments of some inventive concepts may not be limited thereto; for example, some other example embodiments may include a dark current suppression layer 111 including a zirconium oxide (ZrO) layer and a lanthanum oxide (LaO) layer that have different thicknesses in a height direction.

Some example embodiments may include, in addition to one or more of the combinations of the layers described above, a first layer of the dark current suppression layer 111 that includes at least one material selected from among aluminum oxide (AlO), tantalum oxide (TaO), hafnium oxide (HfO), zirconium oxide (ZrO), and lanthanum oxide (LaO). Some example embodiments may include a second layer of the dark current suppression layer 111 that includes a material other than the material of the first layer. In some example embodiments, the dark current suppression layer 111 may be formed by laminating the second layer on the first layer.

Some example embodiments may include a dark current suppression layer 111 that is formed by laminating three layers. For example, a dark current suppression layer 111 may be formed by laminating an aluminum oxide (AlO) layer, a tantalum oxide (TaO) layer, and a hafnium oxide (HfO) layer above the photodiode 112. In some example embodiments, an aluminum oxide (AlO) layer may be included in a first layer in the dark current suppression layer 111; a tantalum oxide (TaO) layer may be included in the second layer in the dark current suppression layer 111; and/or a hafnium oxide (HfO) layer may be included in a third layer in the dark current suppression layer 111. Some example embodiments may include a dark current suppression layer 111 including a first layer disposed at the bottom; a second layer disposed on the first layer; and/or a third layer disposed on the second layer. Some example embodiments of some inventive concepts may not be limited thereto; for example, some example embodiments may include a dark current suppression layer 111 in which the positions of the aluminum oxide (AlO) layer, the tantalum oxide (TaO) layer, and/or the hafnium oxide (HfO) layer are interchanged. Some example embodiments may include a dark current suppression layer 111 including an aluminum oxide (AlO) layer, a tantalum oxide (TaO) layer, and/or a hafnium oxide (HfO) layer, each having a same or similar thickness in a height direction as other layers of the dark current suppression layer 111. Some example embodiments of some inventive concepts may not be limited thereto; for example, some other example embodiments may include a dark current suppression layer 111 including an aluminum oxide (AlO) layer, a tantalum oxide (TaO) layer, and/or a hafnium oxide (HfO) layer that have different thicknesses in a height direction.

Some example embodiments may include a dark current suppression layer 111 that is formed by laminating three layers. For example, a dark current suppression layer 111 may be formed by laminating a tantalum oxide (TaO) layer, a hafnium oxide (HfO) layer, and/or a zirconium oxide (ZrO) layer above the photodiode 112. In some example embodiments, a tantalum oxide (TaO) layer may be disposed as a first layer in the dark current suppression layer 111; a hafnium oxide (HfO) layer may be disposed at the second layer in the dark current suppression layer 111; and/or a zirconium oxide (ZrO) layer may be disposed at the third layer in the dark current suppression layer 111. Some example embodiments may include a dark current suppression layer 111 including a first layer disposed at the bottom, a second layer disposed on the first layer, and/or a third layer disposed on the second layer. Some example embodiments of some inventive concepts may not be limited thereto; for example, some example embodiments may include a dark current suppression layer 111 in which the positions of the tantalum oxide (TaO) layer, the hafnium oxide (HfO) layer, and the zirconium oxide (ZrO) layer are interchanged. Some example embodiments may include a dark current suppression layer 111 including a tantalum oxide (TaO) layer, a hafnium oxide (HfO) layer, and/or a zirconium oxide (ZrO) layer, each having a same or similar thickness in a height direction as other layers of the dark current suppression layer 111. Some example embodiments of some inventive concepts may not be limited thereto; for example, some other example embodiments may include a dark current suppression layer 111 including a tantalum oxide (TaO) layer, a hafnium oxide (HfO) layer, and/or a zirconium oxide (ZrO) layer that have different thicknesses in a height direction.

Some example embodiments may include a dark current suppression layer 111 that is formed by laminating three layers. For example a dark current suppression layer 111 may be formed by laminating a hafnium oxide (HfO) layer, a zirconium oxide (ZrO) layer, and/or a lanthanum oxide (LaO) layer above the photodiode 112. In some example embodiments, a hafnium oxide (HfO) layer may be included in the first layer in the dark current suppression layer 111; a zirconium oxide (ZrO) layer may be included in second layer in the dark current suppression layer 111; and/or a lanthanum oxide (LaO) layer may be included in the third layer in the dark current suppression layer 111. Some example embodiments may include a dark current suppression layer 111 including a first layer disposed at the bottom, a second layer disposed on the first layer, and/or a third layer disposed on the second layer. Some example embodiments of some inventive concepts may not be limited thereto; for example, some example embodiments may include a dark current suppression layer 111 in which the positions of the hafnium oxide (HfO) layer, the zirconium oxide (ZrO) layer, and the lanthanum oxide (LaO) layer are interchanged. Some example embodiments may include a dark current suppression layer 111 including a hafnium oxide (HfO) layer, a zirconium oxide (ZrO) layer, and/or a lanthanum oxide (LaO) layer, each having a same or similar thickness in a height direction as other layers of the dark current suppression layer 111. Some example embodiments of some inventive concepts may not be limited thereto; for example, some other example embodiments may include a dark current suppression layer 111 including a hafnium oxide (HfO) layer, a zirconium oxide (ZrO) layer, and/or a lanthanum oxide (LaO) layer that have different thicknesses in a height direction.

Some example embodiments may include, in addition to the combinations of layers described above, a first layer of the dark current suppression layer 111 including one or more materials selected from aluminum oxide (AlO), tantalum oxide (TaO), hafnium oxide (HfO), zirconium oxide (ZrO), and lanthanum oxide (LaO). In some example embodiments, a second layer of the dark current suppression layer 111 may include a material other than the materials of the first layer, and/or a third layer of the dark current suppression layer 111 may include a material other than materials of the first layer and the second layer.

Some example embodiments may include a dark current suppression layer 111 that is formed by laminating four layers. For example, a dark current suppression layer 111 may be formed by laminating an aluminum oxide (AlO) layer, a tantalum oxide (TaO) layer, a hafnium oxide (HfO) layer, and/or a zirconium oxide (ZrO) layer above the photodiode 112. Some example embodiments may include an aluminum oxide (AlO) layer disposed at the first layer in the dark current suppression layer 111; a tantalum oxide (TaO) layer disposed at the second layer in the dark current suppression layer 111; a hafnium oxide (HfO) layer disposed at the third layer in the dark current suppression layer 111; and/or a zirconium oxide (ZrO) layer disposed at a fourth layer in the dark current suppression layer 111. Some example embodiments may include a dark current suppression layer 111 including a first layer disposed at the bottom, a second layer disposed on the first layer, a third layer disposed on the second layer, and/or a fourth layer disposed on the third layer. Some example embodiments of some inventive concepts may not be limited thereto; for example, some example embodiments may include a dark current suppression layer 111 in which the positions of the aluminum oxide (AlO) layer, the tantalum oxide (TaO) layer, the hafnium oxide (HfO) layer, and the zirconium oxide (ZrO) layer are interchanged. Some example embodiments may include a dark current suppression layer 111 including an aluminum oxide (AlO) layer, a tantalum oxide (TaO) layer, a hafnium oxide (HfO) layer, and/or a zirconium oxide (ZrO) layer, each that having a same or similar thickness in a height direction as other layers of the dark current suppression layer 111. Some example embodiments of some inventive concepts may not be limited thereto; for example, some other example embodiments may include an aluminum oxide (AlO) layer, a tantalum oxide (TaO) layer, a hafnium oxide (HfO) layer, and a zirconium oxide (ZrO) layer may have different thicknesses in the dark current suppression layer 111.

Some example embodiments may include dark current suppression layer 111 that is formed by laminating four layers. For example, a dark current suppression layer 111 may be formed by laminating a hafnium oxide (HfO) layer, a tantalum oxide (TaO) layer, a zirconium oxide (ZrO) layer, and/or lanthanum oxide (LaO) layer above the photodiode 112. Some example embodiments may include a tantalum oxide (TaO) layer included in a first layer in the dark current suppression layer 111; a hafnium oxide (HfO) layer included in a second layer in the dark current suppression layer 111; a zirconium oxide (ZrO) layer included in a third layer in the dark current suppression layer 111; and/or a lanthanum oxide (LaO) layer included in a fourth layer in the dark current suppression layer 111. Some example embodiments may include a dark current suppression layer 111 including a first layer disposed at the bottom, a second layer disposed on the first layer, a third layer disposed on the second layer, and/or a fourth layer disposed on the third layer. Some example embodiments of some inventive concepts may not be limited thereto; for example, some example embodiments may include a dark current suppression layer 111 in which the positions of the tantalum oxide (TaO) layer, the hafnium oxide (HfO) layer, the zirconium oxide (ZrO) layer, and the lanthanum oxide (LaO) layer are interchanged. Some example embodiments may include a dark current suppression layer 111 including a tantalum oxide (TaO) layer, a hafnium oxide (HfO) layer, a zirconium oxide (ZrO) layer, and/or a lanthanum oxide (LaO) layer, each having a same or similar thickness in a height direction as other layers of the dark current suppression layer 111. Some example embodiments of some inventive concepts may not be limited thereto; for example, some other example embodiments may include a dark current suppression layer 111 including a tantalum oxide (TaO) layer, a hafnium oxide (HfO) layer, a zirconium oxide (ZrO) layer, and/or a lanthanum oxide (LaO) layer that have different thicknesses in a height direction.

Some example embodiment may include dark current suppression layer 111 that is formed by laminating four layers. For example, a dark current suppression layer 111 may be formed by laminating an aluminum oxide (AlO) layer, a tantalum oxide (TaO) layer, a hafnium oxide (HfO) layer, and a lanthanum oxide (LaO) layer above the photodiode 112. In some example embodiments, an aluminum oxide (AlO) layer may be included in a first layer in the dark current suppression layer 111; a tantalum oxide (TaO) layer may be included in a second layer in the dark current suppression layer 111; a hafnium oxide (HfO) layer included in a third layer in the dark current suppression layer 111; and/or a lanthanum oxide (LaO) layer included in a fourth layer in the dark current suppression layer 111. Some example embodiments may include a dark current suppression layer 111 including a first layer disposed at the bottom; a second layer disposed on the first layer; a third layer disposed on the second layer; and/or a fourth layer disposed on the third layer. Some example embodiments of some inventive concepts may not be limited thereto; for example, some example embodiments may include a dark current suppression layer 111 in which the positions of the aluminum oxide (AlO) layer, the tantalum oxide (TaO) layer, the hafnium oxide (HfO) layer, and/or the lanthanum oxide (LaO) layer are interchanged. Some example embodiments may include a dark current suppression layer 111 including an aluminum oxide (AlO) layer, a tantalum oxide (TaO)

layer, a hafnium oxide (HfO) layer, and/or a lanthanum oxide (LaO) layer, each having a same or similar thickness in a height direction as other layers of the dark current suppression layer 111. Some example embodiments of some inventive concepts may not be limited thereto; for example, some other example embodiments may include a dark current suppression layer 111 including an aluminum oxide (AlO) layer, a tantalum oxide (TaO) layer, a hafnium oxide (HfO) layer, and/or a lanthanum oxide (LaO) layer that have different thicknesses in a height direction.

In addition to the combinations of the layers described above, the first layer of the dark current suppression layer 111 may include one or more materials selected from among aluminum oxide (AlO), tantalum oxide (TaO), hafnium oxide (HfO), zirconium oxide (ZrO), and lanthanum oxide (LaO). Some example embodiments may include a second layer of the dark current suppression layer 111 that includes a material other than the materials of a first layer; a third layer of the dark current suppression layer 111 that includes a material other than the materials of the first layer and the second layer; and/or a fourth layer of the dark current suppression layer 111 that includes a material other than the materials of the first layer, the second layer, and the third layer. Some example embodiments may include a dark current suppression layer 111 that is formed by sequentially laminating the first to fourth layers.

Some example embodiments may include an anti-reflective film 113 that is disposed on an upper surface of the dark current suppression layer 111. That is, some example embodiments may include an anti-reflective film 113 that is disposed between the dark current suppression layer 111 and the light shield grid 114.

Figure 3C:
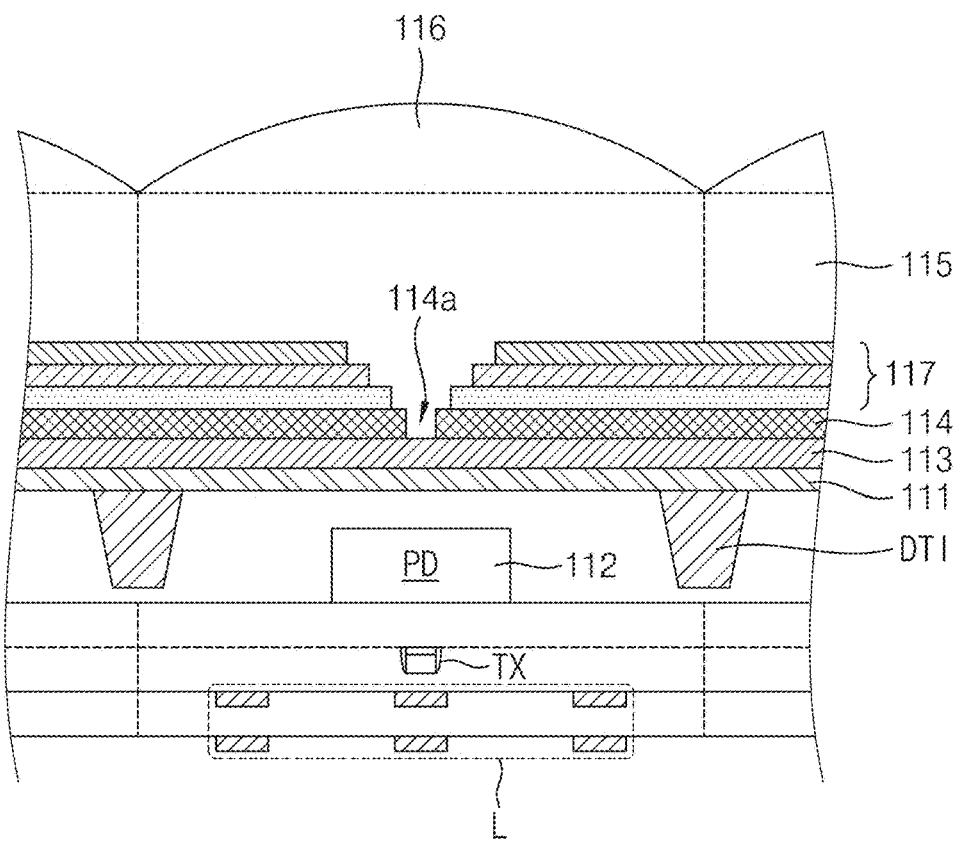
FIG. 3C is a view illustrating a light shielding filter layer of the pixel shown in FIG. 3B according to some example embodiments.

FIG. 3C is a view illustrating a light shielding filter layer that is disposed in the pixel shown in FIG. 3B in accordance with some example embodiments.

Referring to FIG. 3C, the light shield grid 114 may include a metal material such as tungsten (W). The light incident on the pixel 110 may be reflected from an upper surface of the light shield grid 114. If the light reflected from the upper surface of the light shield grid 114 may be viewed outside the pixel 110, then the quality of the image displayed on the OLED panel 210 may be degraded. Some example embodiments of some inventive concepts may prevent or reduce the light being reflected from the upper surface of the light shield grid 114 by including a light shielding filter layer 117 disposed on the light shield grid 114.

In some example embodiments, the light shielding filter layer 117 is not formed above an opening area 114a of the light shield grid 114, but may be disposed so as to overlap the light shield grid 114. The planarization layer 115 may be disposed on the light shielding filter layer 117, and the lens 116 may be disposed on the planarization layer 115. In some example embodiments, the light shielding filter layer 117 may include two or more color filters selected from a group comprising a red color filter, a green color filter, a blue color filter, a cyan color filter, a magenta color filter, and a yellow color filter. In some example embodiments, the two or more color filters may be laminated, and/or may be an organic material, which may be one material or a combination of two or more materials selected from a group consisting of polyacetylene, poly(p-phenylene), polythiophene, poly(3,4-ethylenedioxythiophene) (PEDOT), polypyrrole, poly(p-phenylenesulfide), poly(p-phenylenevinylene), and polyaniline.

In some example embodiments, a planarization layer 115 may be disposed on the light shielding filter layer 117 to have a certain (e.g., desired and/or selected) thickness in a height direction. In some example embodiments, a lens 116 that directs incident light toward the photodiode 112 may be disposed above the planarization layer 115.

Figure 3D:
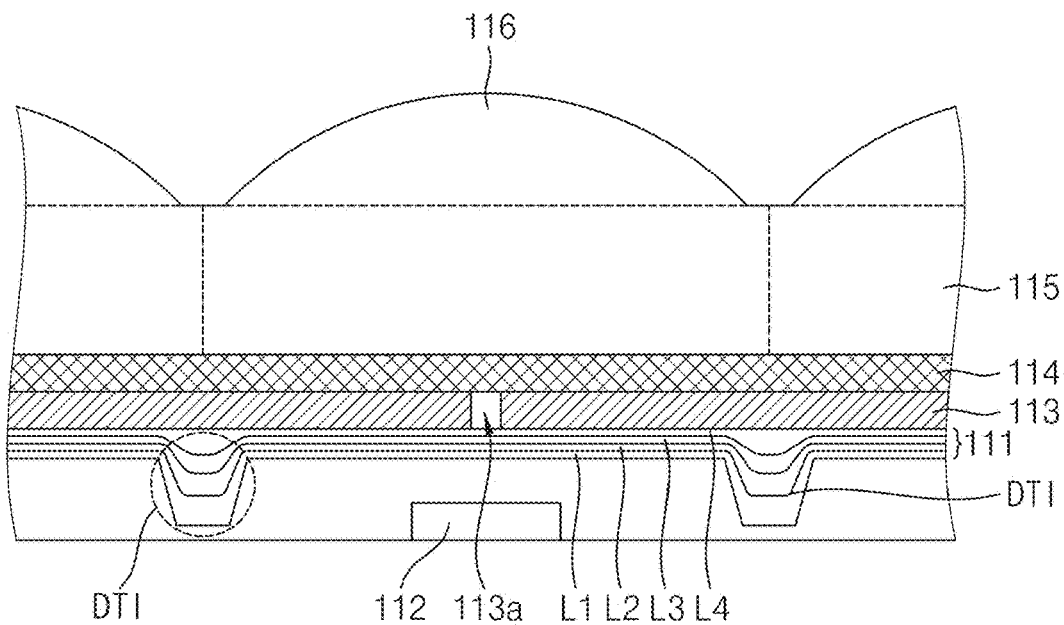
FIG. 3D is a view illustrating a device isolation film and a dark current suppression layer according to some example embodiments.

FIG. 3D is a view specifically illustrating an device isolation film and a dark current suppression layer in accordance with some example embodiments.

Referring to FIG. 3D, a dark current suppression layer 111 may be integrally formed with the deep trench isolation (DTI) and/or may be formed on a front side of the silicon substrate. In some example embodiments, after forming a trench, the dark current suppression layer 111 and the DTI, which include a plurality of layers, may be formed on the front side of the silicon substrate and/or in the trench. In some example embodiments, the dark current suppression layer 111 and/or the DTI may be formed by laminating a plurality of layers. For example, a dark current suppression layer 111 and a DTI may be formed of four layers, where a first layer L1 includes one or more materials selected from among aluminum oxide (AlO), tantalum oxide (TaO), hafnium oxide (HfO), zirconium oxide (ZrO), and lanthanum oxide (LaO); a second layer L2 includes a material other than the material of the first layer; a third layer L3 includes a material other than the materials of the first layer L1 and the second layer L2; and/or a fourth L4 includes a material other than the material of the first to third layers L1, L2, and L3. Some example embodiments of some inventive concepts may not be limited thereto; for example, in some other example embodiments, the dark current suppression layer 111 and the DTI may have only two to three layers, or may have five or more layers. In some example embodiments, the dark current suppression layer 111 and the DTI are integrally formed, and the dark current suppression layer 111 and/or the DTI may be formed by laminating a plurality of layers having a fixed negative charge.

Figure 4A:
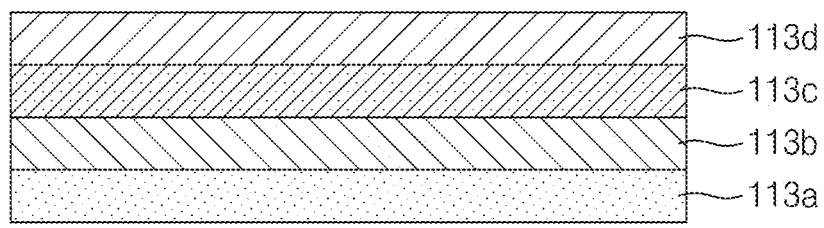
FIGS. 4A and 4B are views illustrating a plurality of films laminated to form an anti-reflective film according to some example embodiments.
Figure 4B:
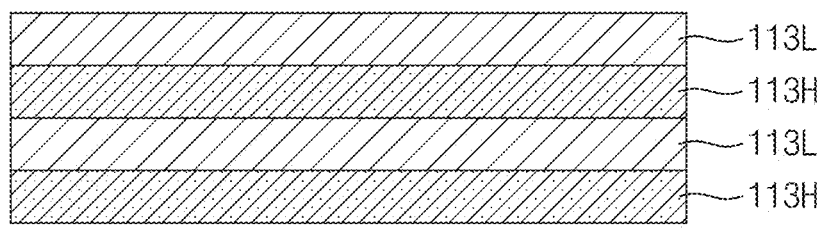

FIGS. 4A and 4B are views illustrating a plurality of films are laminated to form the anti-reflective film in accordance with some example embodiments.

Referring to FIG. 4A, in the anti-reflective film 113, a plurality of sub-films are laminated to prevent or reduce the reflection of the light. In some example embodiments, the anti-reflective film 113 may include a plurality of sub-films. For example, in FIGS. 4A and 4B, the anti-reflective film 113 is formed of four sub-films 113a to 113d. However, some example embodiments of some inventive concepts may not be limited thereto; for example, in some other example embodiments, the anti-reflective film 113 may be formed by overlapping and/or laminating 10 to 40 sub-films.

In some example embodiments, all of the plurality of sub-films of the anti-reflective film 113 may have different refractive indices. Some example embodiments of some inventive concepts may not be limited thereto; for example, in some other example embodiments, some sub-films among the plurality of sub-films of the anti-reflective film 113 may have a same or similar refractive index as other sub-films of the anti-reflective film 113.

In some example embodiments, a first sub-film 113a having a first refractive index may be disposed at a lowermost layer of the anti-reflective film 113; a second sub-film 113b having a second refractive index that is different from the first refractive index may be disposed on the first sub-film 113a; a third sub-film 113c having a third refractive index that is different from the second refractive index may be disposed on the second sub-film 113b; and/or a fourth sub-film 113d having a fourth refractive index that is different from the third refractive index may be disposed on the third sub-film 113c. Some example embodiments may further include a fifth sub-film, a sixth-sub film, a seventh sub-film, an eighth-sub film, a ninth sub-film, and a tenth-sub film, each sub-film having a different refractive index than at least one of the other sub-films.

Some example embodiments may include an anti-reflective film 113 including a second sub-film 113b that has a greater refractive index (first refractive index<second refractive index) than a first sub-film 113a; a third sub-film 113c that has a greater refractive index than a second sub-film 113b (second refractive index<third refractive index); and/or a fourth sub-film 113d that has a greater refractive index than the third sub-film 113c (third refractive index<fourth refractive index). That is, the refractive indices of the sub-layers of the anti-reflective film 113 may increase from a lower portion to an upper portion thereof. Additionally, a fifth sub-film, a sixth-sub film, a seventh sub-film, an eighth sub-film, a ninth sub-film, and/or a tenth sub-film may have refractive indices that increase from the lower portion to the upper portion. Some other example embodiments may include an anti-reflective film 113 including a second sub-film 113b that has a lower refractive index than a first sub-film 113a (first refractive index>second refractive index); a third sub-film 113c that has a lower refractive index than the second sub-film 113b (second refractive index>third refractive index); and/or a fourth sub-film 113d that has a lower refractive index than the third sub-film 113c (third refractive index>fourth refractive index). That is, the refractive indices of the sub-layers of the anti-reflective film 113 may decrease from a lower portion to an upper portion thereof. Additionally, a fifth sub-film, a sixth sub-film, a seventh sub-film, an eighth sub-film, a ninth sub-film, and/or a tenth sub-film may have refractive indices that decrease from the lower portion to the upper portion.

In some example embodiments, each of the plurality of sub-films may have a refractive index within a range of 1.4 to 2.6. In some example embodiments, each of the plurality of sub-films of the anti-reflective film 113 may have a same or similar thickness in a height direction as other sub-films of the anti-reflective film 113. In some example embodiments, each of the plurality of sub-films may have a thickness in a height direction that is within a range of 0.1 µm to 0.5 µm (1,000 Å to 5,000 Å). Some example embodiments of some inventive concepts may not be limited thereto; for example, in some other example embodiments, the plurality of sub-films of the anti-reflective film 113 may have different thicknesses in a height direction relative to other sub-films. For example, the plurality of sub-films may have different thicknesses in a height direction relative to other sub-films, where the thickness in the height direction of each layer may be within a range of 0.1 µm to 0.5 µm (1,000 Å to 5,000 Å).

Referring to FIG. 4B, in an anti-reflective film 113, different sub-films may be alternately laminated to prevent the reflection of the light in accordance with some example embodiments Some example embodiments may include an anti-reflective film 113 that is formed by laminating 2 to 10 sub-film pairs, where each sub-film pair includes a low refractive index film 113L and a high refractive index film 113H. For example, an anti-reflective film 113 may include a plurality of layers in which the first sub-film 113L (low refractive index film) has a first refractive index, and the second sub-film 113H (high refractive index film) has a second refractive index that is greater than the first refractive index, and/or where the layers are alternately laminated. In some example embodiments, the second sub-film 113H (high refractive index film) may be disposed at the lowermost layer of the anti-reflective film 113, and/or the first sub-film 113L (low refractive index film) may be laminated on the second sub-film 113H (high refractive index film), and/or the first sub-film 113L (low refractive index film) and the second sub-film 113H (high refractive index film) may be alternately laminated. In some example embodiments, a first sub-film 113L (low refractive index film) may be disposed at an uppermost layer of the anti-reflective film 113 and/or a second sub-film 113H (high refractive index film) may be disposed at a lowermost layer of the anti-reflective film 113. Some example embodiments of some inventive concepts may not be limited thereto; for example, some other example embodiments may include a second sub-film 113H (high refractive index film) disposed at the uppermost layer of the anti-reflective film 113 and/or a first sub-film 113L (low refractive index film) disposed at the lowermost layer of the anti-reflective film 113.

Some example embodiments may include a plurality of first sub-films 113L (low refractive index film), each having a same or similar refractive index as other first sub-films 113L of the anti-reflective film 113. In some example embodiments, each of the plurality of first sub-films 113L (low refractive index film) may have a refractive index within a range of 1.2 to 1.8. In some example embodiments, each sub-film of a plurality of second sub-films 113H (high refractive index film) may have a same or similar refractive index as other second sub-films of the plurality of second sub-films. In some example embodiments, each second sub-film 113H (high refractive index film) may have a refractive index within a range of 2.0 to 2.8.

In some example embodiments, a plurality of first sub-films 113L (low refractive index film) may have the same or similar thickness in a height direction as other first sub-films of the plurality of first sub-films. For example, each first sub-film of the plurality of first sub-films 113L (low refractive index film) may be formed to a thickness in a height direction that is within a range of 0.1 µm to 0.5 µm (1,000 Å to 5,000 Å). In some example embodiments, each second sub-film of the plurality of second sub-films 113H (high refractive index film) may have a same or similar thickness in a height direction as other second sub-films of the plurality of sub-films. For example, each second sub-film of the plurality of second sub-films 113H (high refractive index film) may be formed to a thickness in a height direction that is within a range of 0.1 µm to 0.5 µm (1,000 Å to 5,000 Å). Some example embodiments of some inventive concepts may not be limited thereto; for example, in some example embodiments, each of the plurality of first sub-films 113L (low refractive index film) may have a different thickness in a height direction relative to other sub-films. For example, in some other example embodiments, each first sub-film of the plurality of first sub-films 113L (low refractive index film) may have a different thickness in a height direction than other first sub-films of the plurality of first sub-films, where the thickness in the height direction of each sub-film is within a range of 0.1 µm to 0.5 µm (1,000 Å to 5,000 Å). In some other example embodiments, each second sub-film of the plurality of second sub-films 113H (high refractive index film) may have a different thickness in a height direction than other second sub-films of the plurality of sub-films, where the thickness in a height direction of each second sub-film is within a range of 0.1 µm to 0.5 µm (1,000 Å to 5,000 Å).

As illustrated in FIG. 4B, some example embodiments may include an anti-reflective film 113 including two laminated pairs of low refractive index films and the high refractive index films. Some example embodiments of some inventive concepts may not be limited thereto; for example, some example embodiments may include an anti-reflective film 113 including one laminated pair or three to ten laminated pairs of low refractive index films and high refractive index films.

Figure 5A:
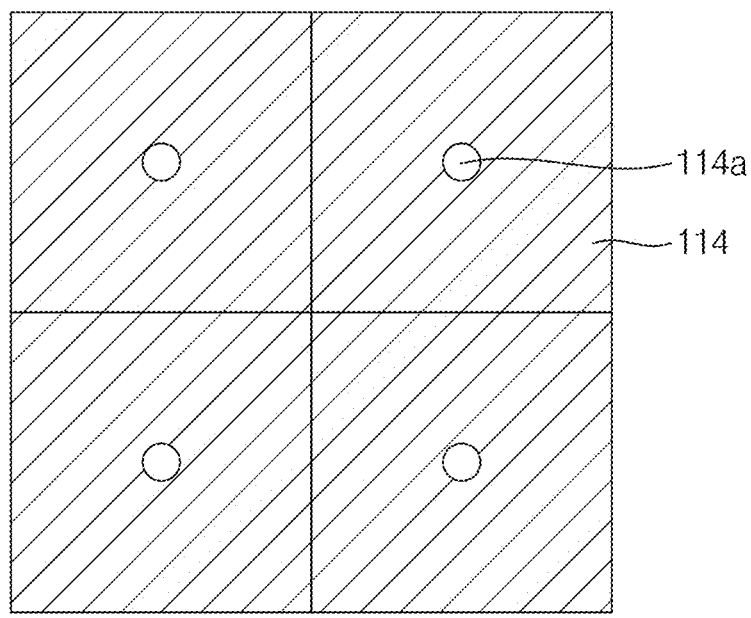
FIGS. 5A and 5B are views illustrating a light shielding grid of an image sensor according to some example embodiments.

As shown in FIG. 5A, some example embodiments may include a light shield grid 114 having a grid having circular shaped opening areas.

Figure 5B:
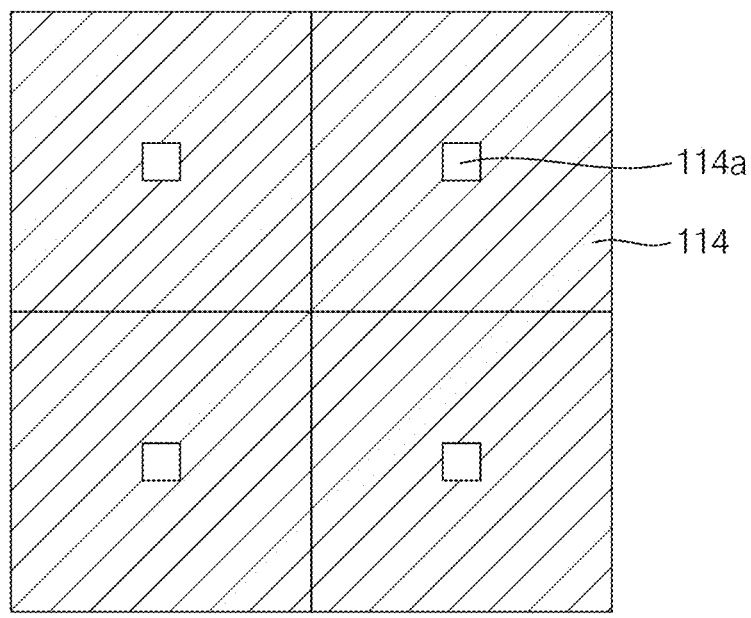

As shown in FIG. 5B, some example embodiments may include a light shield grid 114 having a grid having rectangular shaped opening areas.

Some example embodiments may include a light shield grid 114 including a metal material such as tungsten (W). The image sensor 100 in some example embodiments of some inventive concepts may be configured to generate a fingerprint image, and the opening area 114a of the light shield grid 114 may be very small in a lateral direction. As used herein, the term "lateral direction" means a direction that is substantially parallel to a planar surface of the substrate. Some example embodiments may include a transparent layer including a transparent material that is disposed in the opening area 114a. In some example embodiments, light may be guided to be incident on the photodiode 112 by the opening area 114a of the light shield grid 114, which may be aligned with a central portion of the pixel 110 and/or a central portion of the photodiode 112. In some example embodiments, light may be incident on the photodiode 112 of each pixel without passing over another pixel by the opening area 114a that is aligned with each pixel. Some example embodiments may include an opening area 114 that is filled with the transparent layer including the transparent material.

Some example embodiments may include opening areas 114a of the light shield grid 114, each having an area size that is within a range of 1 to 15% of the total area size of each pixel 110. That is, in some example embodiments, each opening area 114a of the light shield grid 114 may be open by as much as the area of 1 to 15% of the total area of each pixel 110. In some example embodiments, light that is incident on an area of the photodiode 112 through the opening area 114a that is smaller than the area of the pixel 110. In some example embodiments, the opening area 114a of the light shield grid 114 may be very small, which may accurately position the light incident on the photodiode 112 of each pixel and/or may prevent and/or reduce the incidence of light from passing over another adjacent pixel.

In some example embodiments, dark current may be suppressed or reduced in the photodiode 112. For example, the light shield grid 114 may be configured to receive a voltage within a range of 0 V to −2 V, which may be applied to the light shield grid 114 during operation. An application of a voltage within the range of 0V to −2V to the light shield grid 114 including a metal material, dark current may be prevented or reduced during operation of the photodiode 112.

Referring again to FIGS. 3A and 3B, some example embodiments may include a planarization layer 115 disposed on the light shield grid 114. Referring to FIG. 3C, some example embodiments may include a planarization layer 115 disposed on the light shielding filter layer 117. In some example embodiments, an upper surface of the device, on which the lens 116 is disposed, may be flattened by the planarization layer 115. Some example embodiments may include a planarization layer 115 that includes one or more films that are selected from a group consisting of an oxide film, a nitride film, and an oxynitride film. Some example embodiments may include a planarization layer 115 that includes a plurality of films, including two or more films that are selected from a group consisting of the oxide film, the nitride film, and the oxynitride film are laminated.

In some example embodiments light generated in the OLED panel 210 may be reflected by a finger of a user and may be incident on each pixel 110 of the image sensor 100. For example, the light reflected by the finger may pass through the lens 116 and the planarization layer 115, and/or may be incident on the photodiode 112 after passing through the anti-reflective film 113 through the opening area 114a formed by the light shield grid 114.

The BSI image sensor 100 in some example embodiments of some inventive concepts may prevent or reduce interference between the pixels by disposing the DTI between some pixels (e.g., adjacent pixels). In some example embodiments, dark current may be suppressed or reduced by a dark current suppression layer 111 above the photodiode 112. In some example embodiments, light may be prevented or reduced from being reflected by an anti-reflective film 113 disposed above the photodiode 112, which may promote light efficiency in some example embodiments. In some example embodiments, dark current may be suppressed or reduced by disposing a dark current suppression layer 111 above the photodiode 112 and applying voltage within a range of 0V to −2V to the light shield grid 114 formed of a metal material.

Figure 6A:
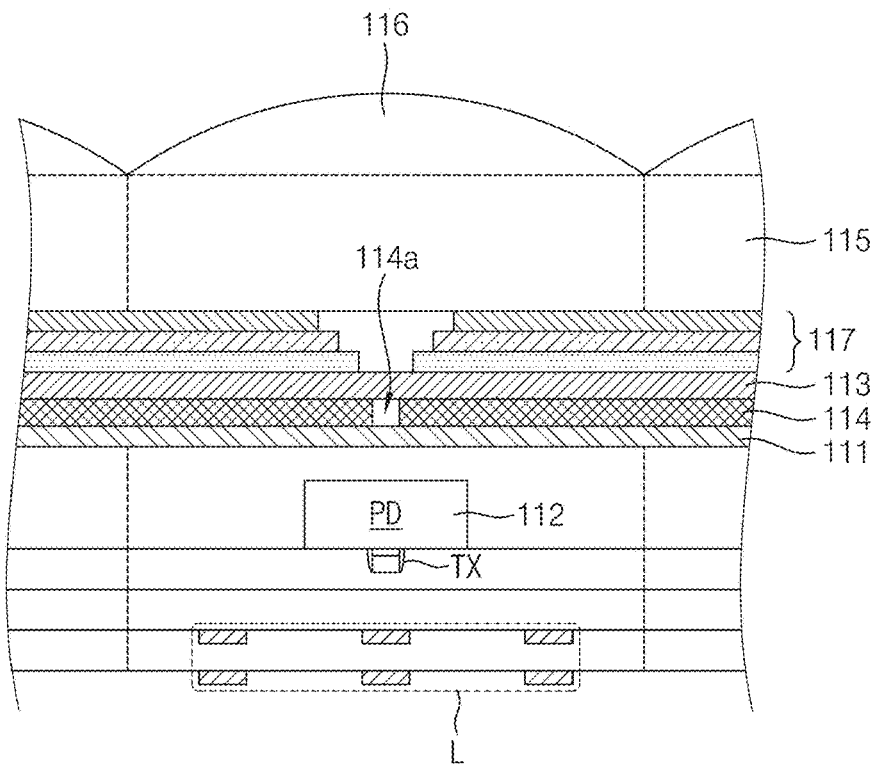
FIG. 6A is a view illustrating a pixel of an image sensor according to some example embodiments of some inventive concepts, in which an anti-reflective film is disposed between a light shield grid and a light shielding filter layer.
Figure 6B:
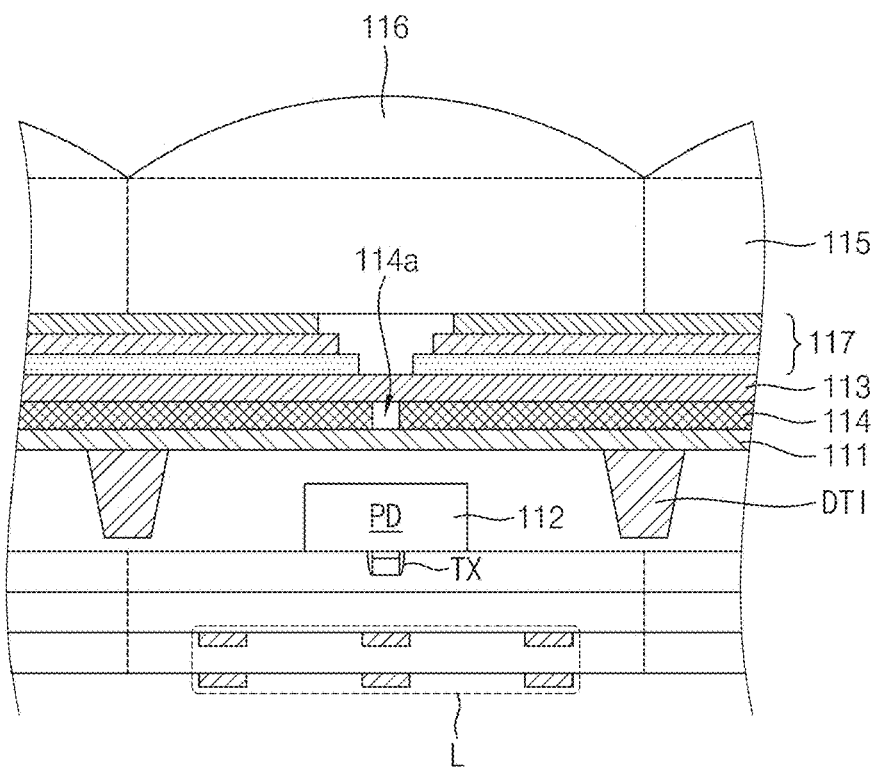
FIG. 6B is a view illustrating a device isolation film is disposed in the pixel shown in FIG. 6A according to some example embodiments.

FIG. 6A is a view illustrating a pixel of an image sensor according to some example embodiments of some inventive concepts, in which an anti-reflective film is disposed between a light shield grid and a light shielding filter layer. FIG. 6B is a view illustrating some example embodiments in which a device isolation film is disposed in the pixel shown in FIG. 6A. In describing a pixel 110 shown in FIGS. 6A and 6B, description of the same or similar configuration as the pixel 110 shown in FIGS. 3A to 3C may be omitted.

Referring to FIGS. 1 and 6A, the pixel 110 of a BSI image sensor 100 in accordance with some example embodiments is shown. In some example embodiments, each pixel of the plurality of pixels 110 may include a dark current suppression layer 111, a photodiode 112, an anti-reflective film 113, a light shield grid 114, a planarization layer 115, a light shielding filter layer 117, and/or a lens 116.

Some example embodiments may include a he photodiode 112 formed on a silicon substrate and configured to receive light and/or to generate photocharges. For example, a plurality of transistors (see FIG. 2) may be disposed on the same layer as the photodiode 112 to be spaced apart from each other and/or may be disposed under the photodiode 112. In some example embodiments, wirings connecting one or more photodiodes 112 to one or more transistors may be disposed under the one or more photodiodes 112. In some example embodiments, during a manufacturing process of the image sensor 100, a portion of a back side of the silicon substrate may be cut to a thickness in a height direction (for example, 3 μm) through which light may be transmitted, and/or a deep trench isolation (DTI) and/or the photodiode 112 may be formed on the back side of the silicon substrate. In some example embodiments, the transistors and the wirings are formed on a front side of the silicon substrate. In some example embodiments, a dark current suppression layer 111 may be disposed above a photodiode 112; a light shield grid 114 may be disposed above the dark current suppression layer 111; an anti-reflective film 113 may be disposed on the light shield grid 114; a light shielding filter layer 117 may be disposed on the anti-reflective film 113; a planarization layer 115 may be disposed on the light shielding filter layer 117; and/or a lens 116 may be disposed on the planarization layer 115. Some example embodiments of some inventive concepts may not be limited thereto; for example, in some other example embodiments, a protection film may be disposed to cover the light shield grid 114.

In some example embodiments, dark current may degrade the performance of some image sensor, and it may be necessary, desirable, and/or advantageous to eliminate, prevent, reduce, and/or suppress dark current. Some example embodiments of some inventive concepts may include a dark current suppression layer 111 that is disposed above the photodiode 112. As one example, the dark current suppression layer 111 may be disposed on an upper side of the silicon substrate, as shown in FIG. 6A.

As shown in FIG. 6B, in some example embodiments, a DTI having a certain (e.g., desired and/or selected) depth may be disposed between some pixels (e.g., adjacent pixels), and/or a dark current suppression layer 111 may be disposed above the photodiode 112. Some example embodiments may include a DTI that prevents or reduces interference between some pixels (such as adjacent pixels) and/or that may be disposed to surround each pixel. Some example embodiments may include a DTI that is formed by forming a trench on the back side of the silicon substrate and then burying an insulating film in the trench. Some example embodiments may include a DTI that has a depth in a height direction of 1 μm to 5 μm. Some example embodiments may include a DTI that includes a deep trench isolation layer including an insulating material, which may have a refractive index that is smaller than the refractive index of the silicon substrate, and may therefore prevent or reduce light incident on each pixel from passing over another adjacent pixel. In some example embodiments, interference of light between adjacent pixels may be prevented or reduced by forming the DTI deep in the substrate in a height direction.

Some example embodiments may include a DTI that is disposed on a back side of the silicon substrate and/or a dark current suppression layer 111 that is disposed above the photodiode 112 and/or the DTI. Some example embodiments may include a dark current suppression layer 111 on a front side of the silicon substrate. In some example embodiments, dark current may be prevented or reduced in the photodiode 112 by applying a voltage within a range of 0V to −2V to the light shield grid 114 and/or the dark current suppression layer 111.

Some example embodiments may include a dark current suppression layer 111 that includes a plurality of laminated layers respectively having a fixed negative charge. In some example embodiments, each layer of the plurality of layers of the dark current suppression layer 111 may include one material or a combination of two or more materials selected from a group comprising aluminum oxide (AlO), tantalum oxide (TaO), hafnium oxide (HfO), zirconium oxide (ZrO), and lanthanum oxide (LaO).

As shown in FIG. 3B, some example embodiments may include a dark current suppression layer 111 that is integrally formed with the DTI. Some example embodiments may include a dark current suppression layer 111 on a front side of the silicon substrate. For example, after a trench is formed, a dark current suppression layer 111 and a DTI, each including a plurality of layers, may be formed on the front side of the silicon substrate and/or the trench. Some example embodiments may include a dark current suppression layer 111 and/or a DTI that include a plurality of laminated layers.

Some example embodiments may include an anti-reflective film 113 that is disposed on the light shield grid 114. Some example embodiments may include an anti-reflective film 113 that is disposed between the light shield grid 114 and the light shielding filter layer 117.

Some example embodiments may include an anti-reflective film 113 including a plurality of laminated sub-films, which may prevent or reduce the reflection of the light. Some example embodiments may include an anti-reflective film 113 including a plurality of sub-films. As shown in FIGS. 4A and 4B, some example embodiments may include an anti-reflective film 113 that includes four sub-films 113a to 113d. However, some example embodiments of some inventive concepts may not be limited thereto; for example, some other example embodiments may include an anti-reflective film 113 including 10 to 40 overlapping sub-films. In some example embodiments, some or all of the sub-films of the of the plurality of sub-films of the anti-reflective film 113 may have a refractive index that is different than the refractive indices of other sub-films of the plurality of sub-films. Some example embodiments of some inventive concepts may not be limited thereto; for example, in some example embodiments, some sub-films among the plurality of sub-films of the anti-reflective film 113 may have a refractive index that is the same or similar to the refractive indices of other sub-films of the anti-reflective film 113.

Some example embodiments of some inventive concepts may prevent or reduce light from being reflected from an upper surface of the light shield grid 114 by a light shielding filter layer 117 on an anti-reflective film 113. In some example embodiments, a light shielding filter layer 117 is not disposed above an opening area 114a of the light shield grid 114, but is instead disposed so as to overlap the light shield grid 114. In some example embodiments, a transparent layer including a transparent material may be disposed in the opening area 114a.

Some example embodiments may prevent or reduce light from being reflected from the upper surface of the light shield grid 114 by including a light shielding filter layer 117 including laminated layers, wherein the laminated layers include at least one of a red color filter, a green color filter, and a blue color filter.

Some example embodiments may include a light shielding filter layer 117 including a laminated structure in which two or more laminated layers of color filters are selected from a group comprising a red color filter, a green color filter, a blue color filter, a cyan color filter, a magenta color filter, and a yellow color filter. In some example embodiment may include color filters of the light shielding filter layer 117 that include an organic material.

Some example embodiments may include color filters of the light shielding filter layer 117 that include organic material, which may be one material or a combination of two or more materials selected from a group consisting of polyacetylene, poly(p-phenylene), polythiophene, poly(3,4-ethylenedioxythiophene) (PEDOT), polypyrrole, poly(p-phenylenesulfide), poly(p-phenylenevinylene), and polyaniline.

Some example embodiments may include a planarization layer 115 that is disposed on the light shielding filter layer 117. In some example embodiments, an upper surface of the device, on which a lens 116 is disposed, may be flattened by the planarization layer 115. Some example embodiments may include a planarization layer 115 that include ones or more films selected from the group consisting of an oxide film, a nitride film, and an oxynitride film. Some example embodiments may include a planarization layer 115 that includes a plurality of laminated films in which two or more films are selected from the group consisting of the oxide film, the nitride film, and the oxynitride film.

In some example embodiments, light generated in an organic light emitting diode (OLED) panel 210 may be reflected by a finger of a user and may be incident on each pixel 110 of the image sensor 100. For example, light may pass through the lens 116 and/or the planarization layer 115, and/or may be incident on the photodiode 112 after passing through the anti-reflective film 113 through the opening area 114*a* in the light shield grid 114.

The BSI image sensor 100 of some example embodiments of some inventive concepts may prevent or reduce interference between the pixels (e.g., adjacent pixels) by disposing the DTI between the pixels (e.g., adjacent pixels). In some example embodiments, dark current may be suppressed or reduced by a dark current suppression layer 111 that is disposed above the photodiode 112. In some example embodiments, light may be prevented or reduced from being reflected by the anti-reflective film 113 disposed above the photodiode 112, which may promote light efficiency in some example embodiments. In some example embodiments, dark current may be suppressed or reduced by disposing a dark current suppression layer 111 above the photodiode 112 and applying voltage within a range of 0V to −2V to the light shield grid 114 formed of a metal material.

Figure 7A:
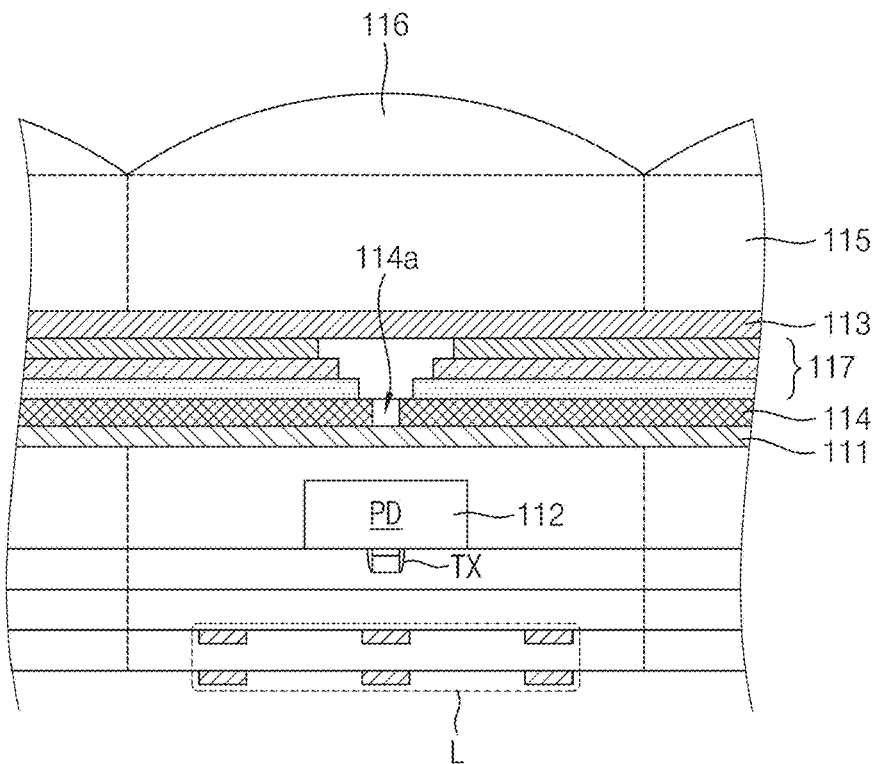
FIG. 7A is a view illustrating a pixel of an image sensor according to some example embodiments of some inventive concepts in which an anti-reflective film is disposed between a light shielding filter layer and a planarization layer.
Figure 7B:
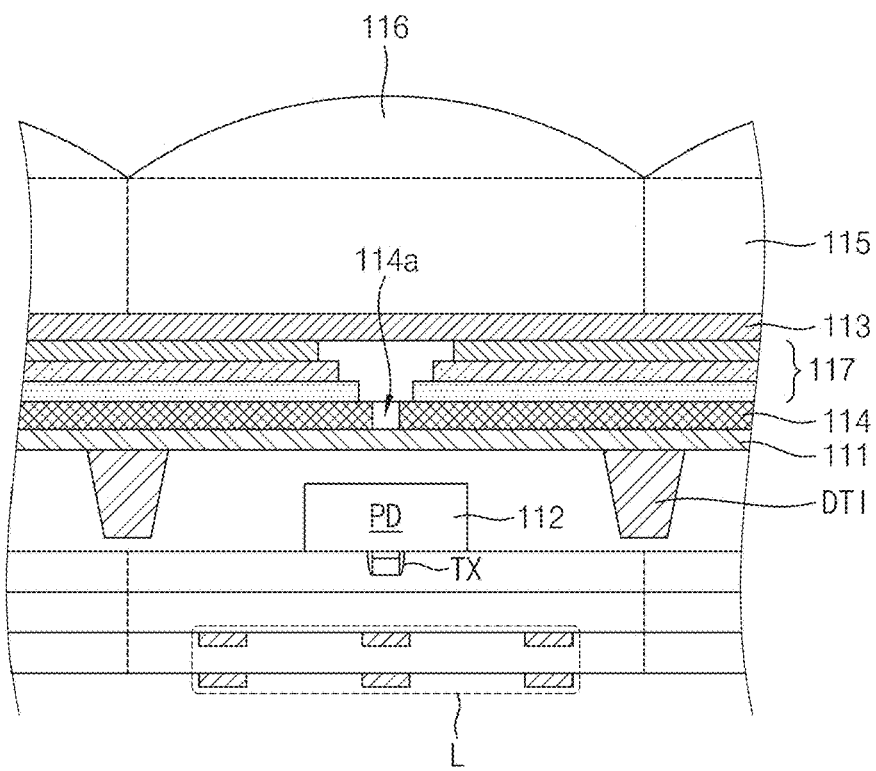
FIG. 7B is a view illustrating a case in which a device isolation film is disposed in the pixel shown in FIG. 7A according to some example embodiments.

FIG. 7A is a view illustrating a pixel of an image sensor according to some example embodiments of some inventive concepts, in which an anti-reflective film is disposed between a light shielding filter layer and a planarization layer. FIG. 7B is a view illustrating a case in which a device isolation film is disposed in the pixel shown in FIG. 7A in accordance with some example embodiments. In describing a pixel 110 shown in FIGS. 7A and 7B, description of the same configuration as the pixel 110 shown in FIGS. 3A to 3C may be omitted.

Referring to FIGS. 1 and 7A, some example embodiments may include a pixel 110 of a BSI image sensor 100. In some example embodiments, each of the plurality of pixels 110 may include a dark current suppression layer 111, a photodiode 112, a light shield grid 114, a light shielding filter layer 117, an anti-reflective film 113, a planarization layer 115, and/or a lens 116.

In some example embodiments, during a manufacturing process of the image sensor 100, a portion of a back side of a silicon substrate may be cut to a thickness in a height direction (for example, 3 μm) through which light may be transmitted, and/or the photodiode 112 may be disposed on a back side of the silicon substrate. In some example embodiments, transistors and/or wirings may be disposed on a front side of the silicon substrate. In some example embodiments, a dark current suppression layer 111 may be disposed above the photodiode 112; a light shield grid 114 may be disposed above the dark current suppression layer 111; a light shielding filter layer 117 may be disposed on the light shield grid 114; an anti-reflective film 113 may be disposed on the light shielding filter layer 117; a planarization layer 115 may be disposed on the anti-reflective film 113; and/or a lens 116 may be disposed on the planarization layer 115.

In some example embodiments, dark current may degrade the performance of some image sensors, and it may be necessary, desirable, and/or advantageous to eliminate, prevent, reduce, and/or suppress dark current. In some example embodiments of some inventive concepts, the dark current suppression layer 111 may be disposed above the photodiode 112. In some example embodiments, a dark current suppression layer 111 may be disposed on an upper side of the silicon substrate.

As shown in FIG. 7B, in some example embodiments, a deep trench isolation (DTI) having a certain (e.g., desired and/or selected) depth may be disposed between some pixels (e.g., between adjacent pixels). In some example embodiments, a dark current suppression layer 111 may be disposed above the photodiode 112.

In some example embodiments, a DTI may reduce interference between some pixels (e.g., adjacent pixels) and/or may be disposed to surround each pixel. Some example embodiments may include a DTI that is formed by forming a trench on a back side of the silicon substrate, and then burying an insulating film in the trench. Some example embodiments may include a DTI having a depth in a height direction of 1 μm to 5 μm. In some example embodiments, a DTI may include a deep trench isolation layer including an insulating material, which may have a refractive index that is smaller than the refractive index of the silicon substrate, which may prevent or reduce light incident on each pixel from passing over another adjacent pixel. In some example embodiments, interference of the light between adjacent pixels may be prevented or reduced by forming the DTI deep in a height direction in the substrate.

Some example embodiments may include a DTI that is disposed on a back side of the silicon substrate and/or a dark current suppression layer 111 that is disposed above the photodiode 112 and/or the DTI. Some example embodiments may include a dark current suppression layer 111 that is integrally formed with a DTI. Some example embodiments may include a dark current suppression layer 111 that is disposed on a front side of the silicon substrate. In some example embodiments, dark current may be prevented or reduced in the photodiode 112 by applying voltage within the range of 0V to −2V to the light shield grid 114 and/or the dark current suppression layer 111.

Some example embodiments may include a dark current suppression layer 111 including a plurality of laminated layers respectively having a fixed negative charge. In some example embodiments, each layer of the plurality of layers of the dark current suppression layer 111 may include one material or a combination of two or more materials in the group including aluminum oxide (AlO), tantalum oxide (TaO), hafnium oxide (HfO), zirconium oxide (ZrO), and lanthanum oxide (LaO).

In some example embodiments, and as shown in FIG. 3C, a dark current suppression layer 111 and a DTI may be integrated together and/or may include a plurality of layers. In some example embodiments, a dark current suppression layer 111 and a DTI may be integrally formed by laminating a plurality of layers, each having a fixed negative charge. Some example embodiments may include an anti-reflective film 113 that is disposed on the light shielding filter layer 117. That is, in some example embodiments, an anti-reflective film 113 may be disposed between the light shielding filter layer 117 and the planarization layer 115.

Some example embodiments may include an anti-reflective film 113 including a plurality of laminated sub-films, which may prevent and/or reduce the reflection of light. Some example embodiments may include an anti-reflective film 113 including a plurality of sub-films. As shown in FIGS. 4A and 4B, some example embodiments may include an anti-reflective film 113 that includes four sub-films 113*a* to 113*d* shown. However, some example embodiments of some inventive concepts may not be limited thereto; for example, some other example embodiments may include an anti-reflective film 113 including 10 to 40 overlapping sub-films. In some example embodiments, each of the sub-films of the plurality of sub-films of the anti-reflective film 113 may have a refractive index that is different than the refractive indices of other sub-films of the anti-reflective film 113. Some example embodiments of some inventive concepts may not be limited thereto; for example, in some other example embodiments, some sub-films among the plurality of sub-films of the anti-reflective film 113 may have the same refractive index.

Some example embodiments of some inventive concepts may prevent or reduce the light being reflected from an upper surface of the light shield grid 114 by including a light shielding filter layer 117 disposed on the light shield grid 114. The light shielding filter layer 117 is not formed above an opening area 114a of the light shield grid 114 but may be disposed so as to overlap the light shield grid 114. A transparent layer formed of a transparent material may be disposed in the opening area 114a.

As one example, in order to prevent the light from being reflected from the upper surface of the light shield grid 114, the light shielding filter layer 117 may be disposed in a laminated form of a red color filter, a green color filter, and a blue color filter.

As one example, the light shielding filter layer 117 may be formed in a structure in which two or more color filters selected from the group consisting of the red color filter, the green color filter, the blue color filter, a cyan color filter, a magenta color filter, and a yellow color filter are laminated. The color filters of the light shielding filter layer 117 may be an organic material.

The color filters of the light shielding filter layer 117 may be the organic material. The organic material that is the material of the color filter may be one material or a combination of two or more materials selected from the group consisting of polyacetylene, poly(p-phenylene), polythiophene, poly(3,4-ethylenedioxythiophene) (PEDOT), polypyrrole, poly(p-phenylenesulfide), poly(p-phenylenevinylene), and polyaniline.

An upper surface, on which the lens 116 is disposed, may be flattened by the planarization layer 115. As one example, the planarization layer 115 may include one or more films selected from the group consisting of an oxide film, a nitride film, and an oxynitride film. As one example, the planarization layer 115 may include a plurality of films in which two or more films selected from the group consisting of the oxide film, the nitride film, and the oxynitride film are laminated.

The light generated in an organic light emitting diode (OLED) panel 210 may be reflected by a finger and incident on each pixel 110 of the image sensor 100. The light passes through the lens 116 and the planarization layer 115. Thereafter, the light may be incident on the photodiode 112 after passing through the anti-reflective film 113 through the opening area 114a formed by the light shield grid 114.

The BSI image sensor 100 of some example embodiments of some inventive concepts may prevent or reduce the interference between the pixels by disposing the DTI between the pixels. The dark current may be suppressed from being generated by the dark current suppression layer 111 disposed above the photodiode 112. The light may be prevented from being reflected by the anti-reflective film 113 disposed above the photodiode 112, so that light efficiency may be improved. Further, dark current may be suppressed or reduced by disposing the dark current suppression layer 111 above the photodiode 112 and applying voltage within a range of 0V to −2V to the light shield grid 114 formed of a metal material.

Figure 8A:
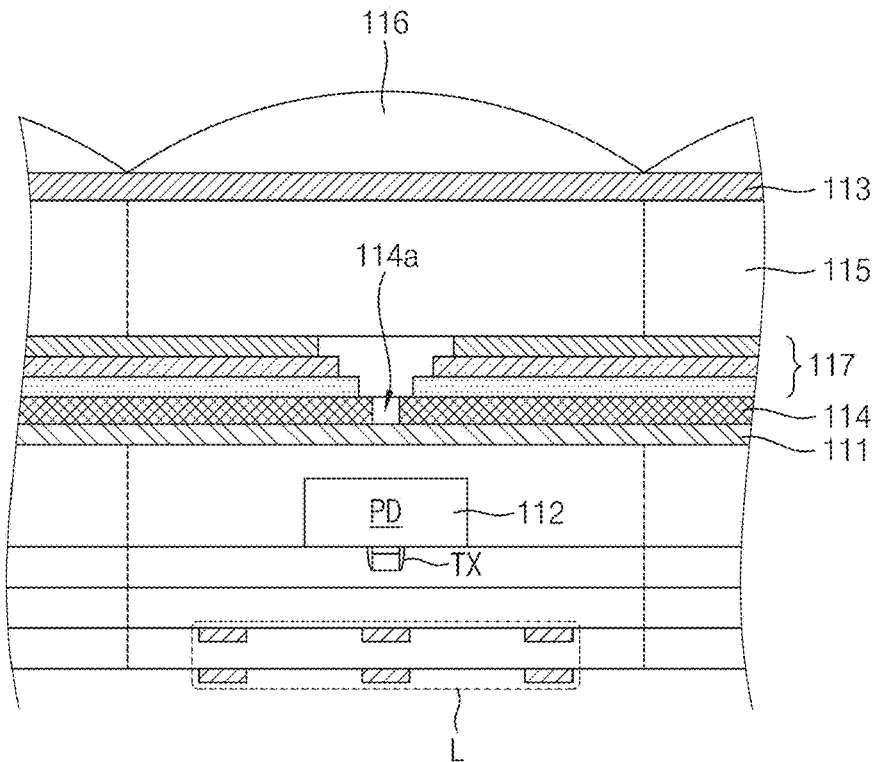
FIG. 8A is a view illustrating a pixel of an image sensor according to some example embodiments of some inventive concepts in which an anti-reflective film is disposed between a planarization layer and a lens.
Figure 8B:
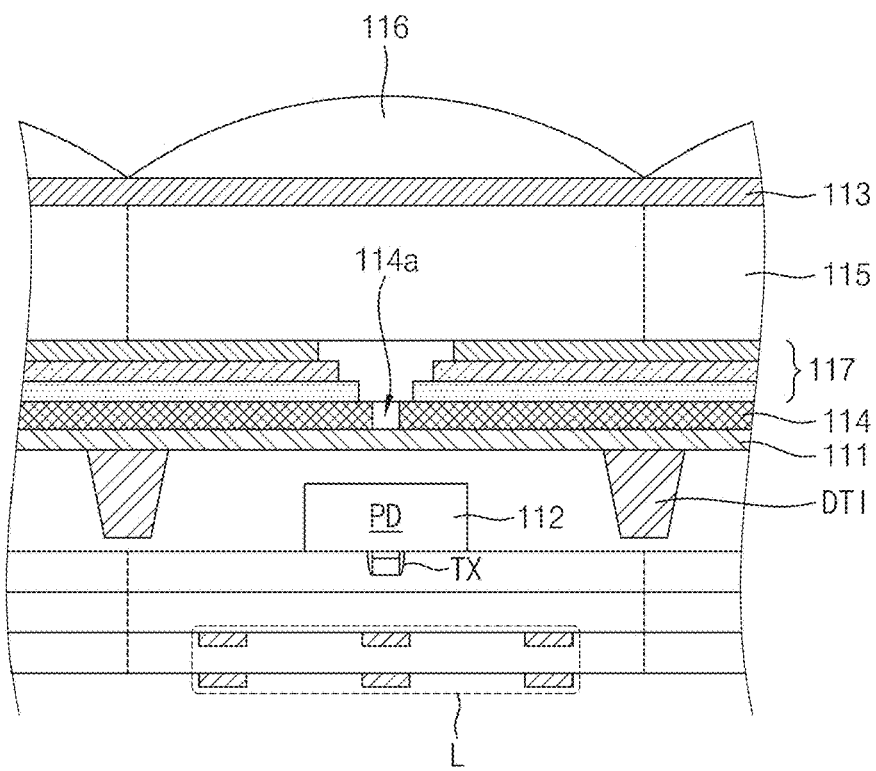
FIG. 8B is a view illustrating a device isolation film of the pixel shown in FIG. 8A according to some example embodiments.

FIG. 8A is a view illustrating a pixel of an image sensor according to some example embodiments of some inventive concepts, in which an anti-reflective film is disposed between a planarization layer and a lens. FIG. 8B is a view illustrating a case in which a device isolation film is disposed in the pixel shown in FIG. 8A. In describing a pixel 110 shown in FIGS. 8A and 8B, description of the same configuration as the pixel 110 shown in FIGS. 3A to 3C may be omitted.

Referring to FIGS. 1 and 8A, the pixel 110 of a BSI image sensor 100 in accordance with some example embodiments is shown. Some example embodiments may include an a plurality of pixels 110, each including a dark current suppression layer 111, a photodiode 112, a light shield grid 114, a light shielding filter layer 117, a planarization layer 115, an anti-reflective film 113, and/or a lens 116.

In some example embodiments, during a manufacturing process of an image sensor 100, a portion of a back side of a silicon substrate may be cut to a thickness in a height direction (for example, 3 μm) through which light may be transmitted, and/or a photodiode 112 may be formed on a back side of the silicon substrate. Some example embodiments may include transistors and/or wirings are formed on a front side of the silicon substrate. Some example embodiments may include a dark current suppression layer 111 disposed above a photodiode 112; a light shield grid 114 that is disposed above the dark current suppression layer 111; a light shielding filter layer 117 that is disposed on the light shield grid 114; a planarization layer 115 that is disposed on the light shielding filter layer 117; an anti-reflective film 113 that is disposed on the planarization layer 115; and/or a lens 116 that is disposed on the anti-reflective film 113.

In some example embodiments, dark current may degrade the performance of some image sensors, and it may be necessary, desirable, and/or advantageous to eliminate, prevent, reduce, and/or suppress dark current. In some example embodiments of some inventive concepts, the dark current suppression layer 111 may be disposed above the photodiode 112. Some example embodiments may include a dark current suppression layer 111 disposed on an upper side of the silicon substrate As shown in FIG. 8B, some example embodiments may include a deep trench isolation (DTI) having a certain (e.g., desired and/or selected) depth and disposed between some pixels (e.g., between adjacent pixels). Some example embodiments may include a dark current suppression layer 111 disposed above a photodiode 112.

Some example embodiments may include a DTI that prevents or reduce interference between the pixels and may be disposed to surround each pixel. Some example embodiments may include a DTI that is formed by forming a trench on a back side of the silicon substrate and then burying an insulating film in the trench. Some example embodiments may include a DTI that has a depth of 1 μm to 5 μm in a height direction. Some example embodiments may include a DTI that includes a deep trench isolation layer including an insulating material. Some example embodiments may include a DTI including an insulating material having a refractive index that is smaller than the refractive index of the silicon substrate, which may prevent and/or reduce light incident on each pixel from passing over another adjacent pixel. In some example embodiments, interference of the light between adjacent pixels may be prevented or reduced by forming the DTI deep in a height direction in the substrate.

Some example embodiments may include a DTI that is disposed on a back side of the silicon substrate and/or a dark current suppression layer 111 that is disposed above a photodiode 112 and/or the DTI. Some example embodiments may include a dark current suppression layer 111 may that is integrally formed with the DTI. Some example embodiments may include a dark current suppression layer 111 that is formed on a front side of the silicon substrate.

Some example embodiments may be configured to prevent and/or reduce dark current in the photodiode 112 by applying voltage within a range of 0V to −2V to the light shield grid 114 and/or the dark current suppression layer 111.

Some example embodiments may include a dark current suppression layer 111 including a plurality of laminated layers, each having a fixed negative charge. Some example embodiments may include a dark current suppression layer 111 including a plurality of layers, each including one or more materials or a combination of two or more materials in the group including aluminum oxide (AlO), tantalum oxide (TaO), hafnium oxide (HfO), zirconium oxide (ZrO), and lanthanum oxide (LaO).

As shown in FIG. 3C, some example embodiments may include a dark current suppression layer 111 and a DTI that are integrated together and formed of a plurality of layers. In some example embodiments, the dark current suppression layer 111 and the DTI may be integrally formed by laminating a plurality of layers, each having a fixed negative charge.

Some example embodiments of some inventive concepts may prevent or reduce the light being reflected from an upper surface of the light shield grid 114 by a light shielding filter layer 117 disposed on a light shield grid 114. In some example embodiments, the light shielding filter layer 117 is not disposed above an opening area 114a of the light shield grid 114, but may be disposed so as to overlap the light shield grid 114. Some example embodiments may include an opening area 114a including a transparent layer including a transparent material.

Some example embodiments may prevent or reduce light from being reflected from the upper surface of the light shield grid 114 by including a light shielding filter layer 117 in a laminated form of a red color filter, a green color filter, and a blue color filter.

Some example embodiments may include a light shielding filter layer 117 including a structure of laminated color filters, including two or more color filters that are selected from the group comprising a red color filter, a green color filter, a blue color filter, a cyan color filter, a magenta color filter, and a yellow color filter. In some example embodiments, the color filters of the light shielding filter layer 117 may include an organic material.

Some example embodiments may include color filters of a light shielding filter layer 117 that include an organic material, which may be one material or a combination of two or more materials selected from the group consisting of polyacetylene, poly(p-phenylene), polythiophene, poly(3,4-ethylenedioxythiophene) (PEDOT), polypyrrole, poly(p-phenylenesulfide), poly(p-phenylenevinylene), and polyaniline.

Some example embodiments may include a planarization layer 115 that includes one or more films selected from the group consisting of an oxide film, a nitride film, and an oxynitride film. Some example embodiments may include a, planarization layer 115 including a plurality of films in which two or more films selected from the group consisting of the oxide film, the nitride film, and the oxynitride film are laminated.

Some example embodiments may include an anti-reflective film 113 that is disposed on a planarization layer 115. That is, some example embodiments may include an anti-reflective film 113 disposed between a planarization layer 115 and a lens 116.

Some example embodiments may include an anti-reflective film 113 including a plurality of laminated sub-films, which may prevent and/or reduce a reflection of light. Some example embodiments may include an anti-reflective film 113 that includes a plurality of sub-films. As shown in FIGS. 4A and 4B, some example embodiments may include an anti-reflective film 113 including four sub-films 113a to 113d. However, some example embodiments of some inventive concepts may not be limited thereto; for example, some other example embodiments may include an anti-reflective film 113 including 10 to 40 overlapping sub-films. In some example embodiments, each sub-film the plurality of sub-films of the anti-reflective film 113 may have a refractive index that is different than the refractive indices of other sub-films of the anti-reflective film 113. Some example embodiments of some inventive concepts may not be limited thereto; for example, in some other example embodiments, some sub-films among the plurality of sub-films of the anti-reflective film 113 may have a same or similar refractive index as other sub-films of the anti-reflective film 113.

In some example embodiments, light generated in an organic light emitting diode (OLED) panel 210 may be reflected by a finger of a user and may be incident on each pixel 110 of the image sensor 100. In some example embodiments, the light reflected by the finger may pass through a lens 116, an anti-reflective film 113, and/or a planarization layer 115 and/or may be incident on a photodiode 112 through an opening area 114a formed by a light shield grid 114.

The BSI image sensor 100 of some example embodiments of some inventive concepts may prevent or reduce interference between the pixels by disposing the DTI between some pixels (e.g., adjacent pixels). In some example embodiments, dark current may be suppressed or reduced by a dark current suppression layer 111 disposed above the photodiode 112. In some example embodiments, reflection of light may be prevented or reduced by an anti-reflective film 113 disposed above the photodiode 112, which may promote light efficiency in some example embodiments. In some example embodiments, dark current may be suppressed or reduced by disposing a dark current suppression layer 111 above the photodiode 112 and applying voltage within a range of 0V to −2V to the light shield grid 114 formed of a metal material.

In some example embodiments of some inventive concepts, interference between pixels may be prevented or reduced in a narrow inter-pixel structure, and thus a clear fingerprint image may be generated.

In some example embodiments of some inventive concepts, influence on sensitivity due to wirings may be excluded or reduced by disposing the wirings under a photodiode.

In some example embodiments of some inventive concepts, interference between pixels may be prevented or reduced by disposing a deep trench isolation (DTI) between the pixels.

In some example embodiments of some inventive concepts, a dark current of a photodiode may be reduced by disposing a dark current suppression layer above the photodiode.

In some example embodiments of some inventive concepts, sensing sensitivity of a photodiode may be increased by disposing an anti-reflective film above the photodiode.

In some example embodiments of some inventive concepts, dark current may be suppressed or reduced by applying voltage within a range of 0 V to −2 V to a light shield grid formed of a metal material While some example embodiments of some inventive concepts have been described with reference to the accompanying drawings, various modifications may be made without departing from the scope of the present disclosure. Therefore, the above-described embodiments should be considered in a descriptive sense only and not for purposes of limitation.

What is claimed is:

1. An image sensor comprising:
a substrate;
a photodiode in the substrate;
a light shield grid on the photodiode;
a light shielding filter layer formed above the light shield grid, the light shielding filter layer including an opening above the photodiode;
a planarization layer formed above the light shielding filter layer; and
an anti-reflection film, including a plurality of sub-films on and planar to the planarization layer;
wherein the plurality of sub-films comprises a stack including at least a first sub-film and a second sub-film.

2. The image sensor of claim 1, wherein the first sub-film has a first refractive index and the second sub-film has a second refractive index different from the first refractive index.

3. The image sensor of claim 1, wherein a thickness of the first sub-film and a thickness of the second sub-film are different.

4. The image sensor of claim 1, wherein each of a thickness of the first sub-film and a thickness of the second sub-film is within 0.1 μm-0.5 μm.

5. The image sensor of claim 1, wherein the stack further comprise third to tenth sub-films on the second sub-film.

6. The image sensor of claim 5, wherein at least two of the first to tenth sub-films have a same refractive index.

7. The image sensor of claim 1, wherein the plurality of sub-films include a plurality of low refractive index films and a plurality of high refractive index films alternately laminated on the plurality of low refractive index films.

8. The image sensor of claim 7, wherein each of high refractive index films has a refractive index within a range of 2.0 to 2.8.

9. The image sensor of claim 7, wherein each of low refractive index films has a refractive index within a range of 1.2 to 1.8.

10. The image sensor of claim 1, wherein the plurality of sub-films include 10 to 40 sub-films.

11. An electronic device including image sensor, the image sensor comprising:
a substrate;
a photodiode in the substrate;
a light shield grid on the photodiode;
a light shielding filter layer formed above the light shield grid, the light shielding filter layer including an opening above the photodiode;
a planarization layer formed above the light shielding filter layer;
an anti-reflection layer, including a plurality of sub-films on and planar to the planarization layer; and
an organic light emitting diode panel on the plurality of sub-films;
wherein the plurality of sub-films comprises a stack including at least a first sub-film and a second sub-film.

12. The electronic device of claim 11, wherein the first sub-film has a first refractive index and the second sub-film has a second refractive index different from the first refractive index.

13. The electronic device of claim 11, wherein a thickness of the first sub-film and a thickness of the second sub-film are different.

14. The electronic device of claim 11, wherein each of a thickness of the first sub-film and a thickness of the second sub-film is within 0.1 μm-0.5 μm.

15. The electronic device of claim 11, wherein the stack further comprise third to tenth sub-films on the second sub-film.

16. The electronic device of claim 15, wherein at least two of the first to tenth sub-films have a same refractive index.

17. The electronic device of claim 11, wherein the plurality
of sub-films include a plurality of low refractive index films and a plurality of high refractive index films alternately laminated on the plurality of low refractive index films.

18. The electronic device of claim 17, wherein each of high refractive index films has a refractive index within a range of 2.0 to 2.8.

19. The electronic device of claim 17, wherein each of low refractive index films has a refractive index within a range of 1.2 to 1.8.

20. The electronic device of claim 17, further comprising a touch panel on the organic light emitting diode panel.

* * * * *